(12) United States Patent
Kim et al.

(10) Patent No.: US 12,317,646 B2
(45) Date of Patent: May 27, 2025

(54) LIGHT-EMITTING DEVICE AND DISPLAY APPARATUS INCLUDING THE SAME

(71) Applicant: SAMSUNG ELECTRONICS CO., LTD., Suwon-si (KR)

(72) Inventors: Hyunjoon Kim, Seoul (KR); Seogwoo Hong, Yongin-si (KR); Kyungwook Hwang, Seoul (KR); Dongho Kim, Seoul (KR); Joonyong Park, Suwon-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 611 days.

(21) Appl. No.: 17/591,772

(22) Filed: Feb. 3, 2022

(65) Prior Publication Data
US 2022/0344542 A1    Oct. 27, 2022

Related U.S. Application Data

(60) Provisional application No. 63/180,352, filed on Apr. 27, 2021.

(30) Foreign Application Priority Data

Aug. 5, 2021    (KR) .................. 10-2021-0103431

(51) Int. Cl.
*H10H 20/831*    (2025.01)
*H01L 25/075*    (2006.01)
(Continued)

(52) U.S. Cl.
CPC ..... *H10H 20/8312* (2025.01); *H01L 25/0753* (2013.01); *H10H 20/814* (2025.01); *H10H 20/819* (2025.01); *H10H 20/857* (2025.01)

(58) Field of Classification Search
CPC ....... H01L 33/382; H01L 33/10; H01L 33/20; H01L 33/62; H01L 25/167;
(Continued)

(56) References Cited

U.S. PATENT DOCUMENTS 5,696,389 A  * 12/1997  Ishikawa ................. H01L 33/20
                                                              257/773
10,516,084 B2    12/2019  Sasaki et al.
(Continued)

FOREIGN PATENT DOCUMENTS

CN        211719593 U    10/2020
JP        2009-158812 A    7/2009
(Continued)

OTHER PUBLICATIONS

Kang, Chang-Mo et al., "Hybrid Full-Color Inorganic Light-Emitting Diodes Integrated on a Single Wafer Using Selective Area Growth and Adhesive Bonding", ACS Photonics, Sep. 25, 2018, vol. 5, pp. 4413-4422. (10 pages total).
(Continued)

*Primary Examiner* — Julia Slutsker
(74) *Attorney, Agent, or Firm* — Sughrue Mion, PLLC

(57) ABSTRACT

A light-emitting device may include a light-emitting cell emitting first-color light and second-color light, an insulating layer having a flat upper surface while covering the light-emitting cell, a first trench exposing a first semiconductor layer, a second trench exposing a second semiconductor layer, a first electrode in contact with the first semiconductor layer, a second electrode in contact with the second semiconductor layer, and a third electrode in contact with a third semiconductor layer.

23 Claims, 17 Drawing Sheets

(51) Int. Cl.
*H10H 20/814* (2025.01)
*H10H 20/819* (2025.01)
*H10H 20/857* (2025.01)

(58) Field of Classification Search
CPC ............ H01L 25/0753; H10H 20/8312; H10H 20/814; H10H 20/819; H10H 20/857; H10H 20/841; H10H 29/0362; H05K 5/10; H10D 30/0295; H10D 84/858
See application file for complete search history.

(56) References Cited

U.S. PATENT DOCUMENTS

| | | | |
|---|---|---|---|
| 2020/0144326 A1* | 5/2020 | Lee | H01L 27/15 |
| 2020/0235084 A1* | 7/2020 | Wu | H01L 25/0753 |
| 2020/0365648 A1 | 11/2020 | Jang et al. | |
| 2021/0233795 A1* | 7/2021 | Wang | H01L 22/20 |
| 2022/0051924 A1 | 2/2022 | Kim et al. | |
| 2023/0343810 A1 | 10/2023 | Kim et al. | |

FOREIGN PATENT DOCUMENTS

| | | |
|---|---|---|
| KR | 10-2010-0111831 A | 10/2010 |
| KR | 10-2017-0112776 A | 10/2017 |
| KR | 10-2020-0085788 A | 7/2020 |
| KR | 10-2022-0021325 A | 2/2022 |

OTHER PUBLICATIONS

Templier, F. et al., "A New Approach for Fabricating High-Performance MicroLED Displays", SID Symposium Digest of Technical Papers 50, 2019, pp. 240-243. (4 pages total).

Fujiwara, Yasufumi et al., "High Brightness and RGB Integration of Eu-doped GaN-based Red LEDs for Ultrahigh-resolution Micro-LED Display", SID Symposium Digest of Technical Papers 51, 2020, pp. 691-694. (4 pages total).

Communication issued on Aug. 1, 2024 by the Korean Intellectual Property Office for Korean Patent Application No. 10-2021-0103431.

* cited by examiner

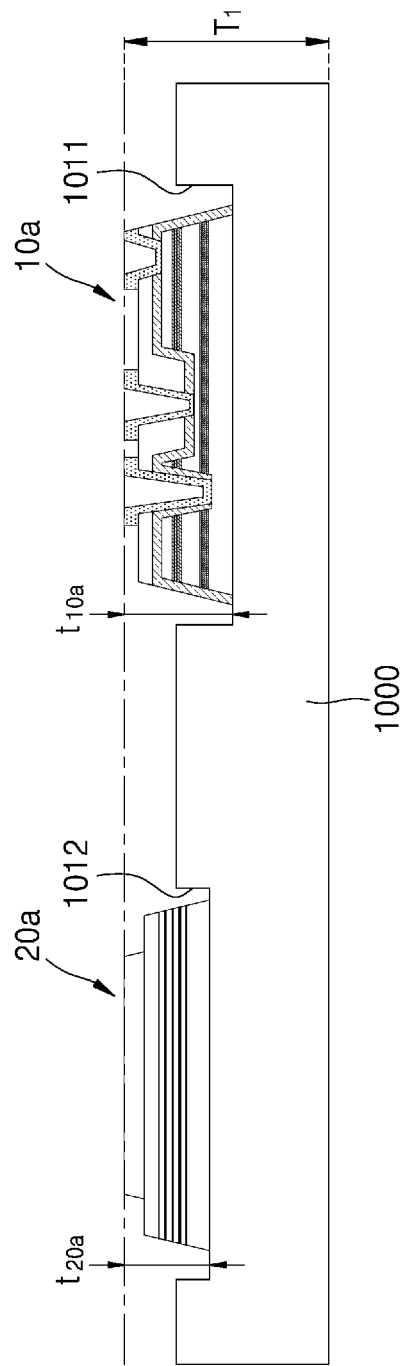

LIGHT-EMITTING DEVICE AND DISPLAY APPARATUS INCLUDING THE SAME

CROSS-REFERENCE TO RELATED APPLICATIONS

This application is based on and claims the benefit of U.S. Provisional Patent Application No. 63/180,352, filed on Apr. 27, 2021, in the United States Patent and Trademark Office, and is based on and claims priority under 35 U.S.C. § 119 to Korean Patent Application No. 10-2021-0103431, filed on Aug. 5, 2021, in the Korean Intellectual Property Office, the disclosures of which are incorporated herein by reference in their entirety.

BACKGROUND

1. Field

The disclosure relates to a light-emitting device and a display apparatus including the same.

2. Description of the Related Art

A micro-light-emitting diode (LED) display is made by arranging hundreds of thousands of LEDs each with a size of several to hundreds of micrometers (μm) or less on a substrate, and as each micro LED functions as a sub-pixel of the display, the micro LED display has characteristics of high efficiency, high definition, and high resolution compared to a liquid-crystal display (LCD) or an organic light-emitting diode (OLED) display in the art. When manufacturing such a micro-LED display, a substrate (silicon or sapphire) on which an LED chip is grown needs to be transferred to a display substrate (glass). In this operation, even when only 0.1% of defects occur, an operation of individually transferring or repairing at least several hundreds of micro LEDs may be added, and thus, a manufacturing cost is increased. Therefore, to commercialize the micro-LED displays, high-yield transfer technology that may overcome transfer limitations of a pick and place method in the art and requires little additional transfer or repair is required.

Currently, various types of fluidic self-assembly (FSA) technology are being developed for such a high-yield/low-cost micro-LED transfer. When manufacturing a micro-LED display apparatus in this way, in order to realize full color, a red green blue (RGB) method of respectively transferring micro-LEDs emitting red, green, and blue light, and a method of using a color conversion layer, are mainly used, which includes entirely transferring micro-LEDs emitting blue light and then arranging each color conversion layer on a red sub-pixel and a green sub-pixel.

SUMMARY

Provided is a light-emitting device capable of emitting at least two colors of light.

Provided is a light-emitting device in which heights of a plurality of electrodes arranged in the light-emitting device are substantially equal to one another or are almost close to one another.

Additional aspects will be set forth in part in the description which follows and, in part, will be apparent from the description, or may be learned by practice of the presented embodiments of the disclosure.

According to an aspect of the disclosure, there is provide a light-emitting device including: a light-emitting cell including a first semiconductor layer, a first active layer emitting first-color light, a second semiconductor layer, a second active layer emitting second-color light, and a third semiconductor layer, wherein the first semiconductor layer is provided on the first active layer, the first active layer is provided on the second semiconductor layer, the second semiconductor layer is provided on the second active layer, and the second active layer is provided on the third semiconductor layer; an insulating layer covering the light-emitting cell, the insulating layer having a flat upper surface; a first trench exposing the first semiconductor layer by penetrating through the insulating layer; a second trench exposing the second semiconductor layer by penetrating through the insulating layer; a first electrode extending from the first semiconductor layer to an upper surface of the insulating layer along the first trench; a second electrode extending from the second semiconductor layer to the upper surface of the insulating layer along the second trench; and a third electrode provided to be in contact with the third semiconductor layer.

The insulating layer may include: a first insulating layer covering an upper surface of the light-emitting cell, side surfaces of the first trench, and side surfaces of the second trench; and a second insulating layer arranged on the first insulating layer and configured to reduce a difference between a height of a portion of the first electrode extending outside of the first trench and a portion of the second electrode extending outside of the second trench.

A first height of the first electrode from a lower surface of the light-emitting device and a second height of the second electrode from the lower surface of the light-emitting device may be substantially equal, or within 10% of a thickness of the light-emitting device.

The light-emitting device may further include a third trench exposing the third semiconductor layer by penetrating the insulating layer and a partial area of the light-emitting cell, wherein the third electrode extends from the third semiconductor layer to the upper surface of the insulating layer along the third trench.

The first active layer may be configured to emit the first-color light, wherein the second active layer is configured to emit the second-color light, and wherein only the first active layer or the second active layer is arranged in a partial area of the light-emitting cell viewed from a top view.

The first semiconductor layer and the third semiconductor layer have a same polarity, and the second semiconductor layer has a polarity different from the polarity of the first semiconductor layer, the first electrode and the third electrode have a same polarity, and the second electrode has a polarity opposite to the polarity of the first electrode.

The light-emitting cell may be configured to emit the first-color light as the second electrode is connected to the first electrode, and the light-emitting cell is configured to emit the second-color light as the second electrode is connected to the third electrode.

The second semiconductor layer may be a first sub-semiconductor layer and a second sub-semiconductor layer, the second trench may include a first sub-trench and a second sub-trench spaced apart from the first sub-trench, the first sub-trench exposes the first sub-semiconductor layer by penetrating through the insulating layer, the second sub-trench exposes the second sub-semiconductor layer by penetrating through the insulating layer and a partial area of the light-emitting cell, the second electrode may include a first sub-electrode and a second sub-electrode spaced apart from the first sub-electrode, the first sub-electrode extends from the first sub-semiconductor layer to the upper surface of the insulating layer along the first sub-trench, and the second sub-electrode extends from the second sub-semiconductor layer to the upper surface of the insulating layer along the second sub-trench.

The second sub-semiconductor layer has a greater width than a width of the first sub-semiconductor layer.

The first electrode is electrically connected to the first sub-electrode, and the first active layer is configured to emit the first-color light, and the third electrode is electrically connected to the second sub-electrode, and the second active layer is configured to emit the second-color light.

A position of the first electrode or a position of the first sub-electrode of the light-emitting device arranged in a first direction does not overlap a position of the second electrode or a position of the second sub-electrode of the light-emitting device arranged in a second direction rotated by 180 degrees in the first direction.

The light-emitting cell may include a first-color light-emitting structure and a second-color light-emitting structure, the second semiconductor layer is included in common in the first-color light-emitting structure and the second-color light-emitting structure, and no bonding layer is between the first-color light-emitting structure and the second-color light-emitting structure.

The light-emitting device may further include a distributed Bragg reflector (DBR) layer between the first active layer and the second active layer, wherein, in the DBR layer, a reflectance of the first-color light is greater than a transmittance of the first-color light, and a transmittance of the second-color light is greater than a reflectance of the second-color light.

The third electrode is provided on a lower surface of the light-emitting cell, wherein the second electrode is electrically connected to the first electrode, and wherein the first active layer is configured to emit the first-color light, the second electrode is electrically connected to the third electrode, and the second active layer is configured to emit the second-color light.

The light-emitting cell may further include a third active layer emitting third-color light, and the first-color light, the second-color light, and the third-color light configure one pixel.

The second electrode may be arranged at a center of the light-emitting device, and the first electrode may be symmetrical with respect to the center of the light-emitting device.

A planar shape of the light-emitting device may be rotationally symmetric with respect to at least one angle.

The light-emitting device may have a circular, elliptical, or polygonal plane.

According to another aspect of the disclosure, there is provide a display apparatus may include: an emission layer including the first-type light-emitting device, the first-type light-emitting device having a first planar shape and configured to emit a plurality of colors of light; a second-type light-emitting device having a second planar shape different from the first planar shape of the first-type light-emitting device and configured to emit a different color of light from the plurality of colors of light; and a driving layer including a substrate and a plurality of transistors, wherein the substrate may include a plurality of wells, wherein the plurality of wells may include a first well and a second well, which are adjacent to each other, the first-type light-emitting device is exclusively arranged in the first well, the second-type light-emitting device is exclusively arranged in the second well, and the first well and the second well configure one pixel.

The first well may have a first depth, the first depth may be a depth such that a height of each the first electrode, the second electrode and the third electrode from the lower surface of the light-emitting device substantially same or within 10% of a thickness of the first-type light-emitting device, the second well may have a second depth, the second depth may be a depth such that at least one electrode included in the second-type light-emitting device arranged in the second well is substantially at the height, or is a depth such that the at least one electrode has a height difference within 10% of a thickness of the first-type light-emitting device with the height.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 11 is a cross-sectional view of a substrate of a display apparatus according to an example embodiment;

DETAILED DESCRIPTION

Figure 1:
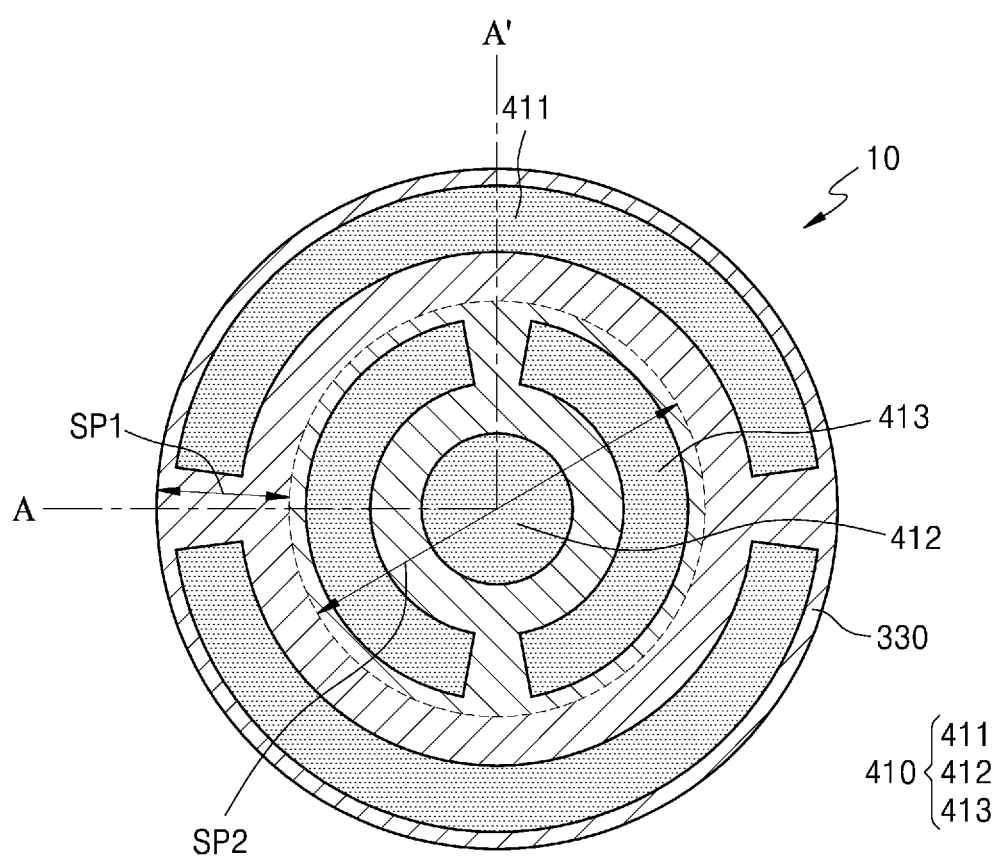
FIG. 1 is a plan view of a light-emitting device according to an example embodiment.

Reference will now be made in detail to embodiments, examples of which are illustrated in the accompanying drawings, wherein like reference numerals refer to like elements throughout. In this regard, the embodiments of the disclosure may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. The disclosure will now be described more fully with reference to the accompanying drawings, in which embodiments of the disclosure are shown. Embodiments to be described are merely exemplary, and various modifications are possible from these embodiments. In the following drawings, like reference numerals in the drawings denote like elements, and sizes or thicknesses of each component may be exaggerated for convenience of explanation.

Hereinafter, in the case where a position relationship between two items is described with the terms "on ~," "on the top of ~," or the like, one or more items may be interposed therebetween unless the term "directly" is used in the expression. Likewise, in the case where a position relationship between two items is described with the terms "below ~," "on the bottom of ~," or the like, one or more items may be interposed therebetween unless the term "directly" is used in the expression.

An expression used in the singular encompasses the expression of the plural, unless it has a clearly different meaning in the context. When a portion "includes" an element, another element may be further included, rather than excluding the existence of the other element, unless otherwise described.

The use of the term "the" and similar referential terms may be used in both the singular and the plural expressions.

The meaning of "connection" may include not only a physical connection, but also an optical connection, an electrical connection, or the like.

The use of exemplary terms (e.g., or the like) is merely for describing the technical idea in detail, and the scope is not limited by the exemplary terms unless limited by the claims.

While such terms as "first," "first-first," etc., may be used to describe various components, such components must not be limited to the above terms. The above terms are used only to distinguish one component from another.

The same or identical length units such as height, depth, and thickness may include differences within an error range recognized by one of ordinary skill in the art.

Figure 2:
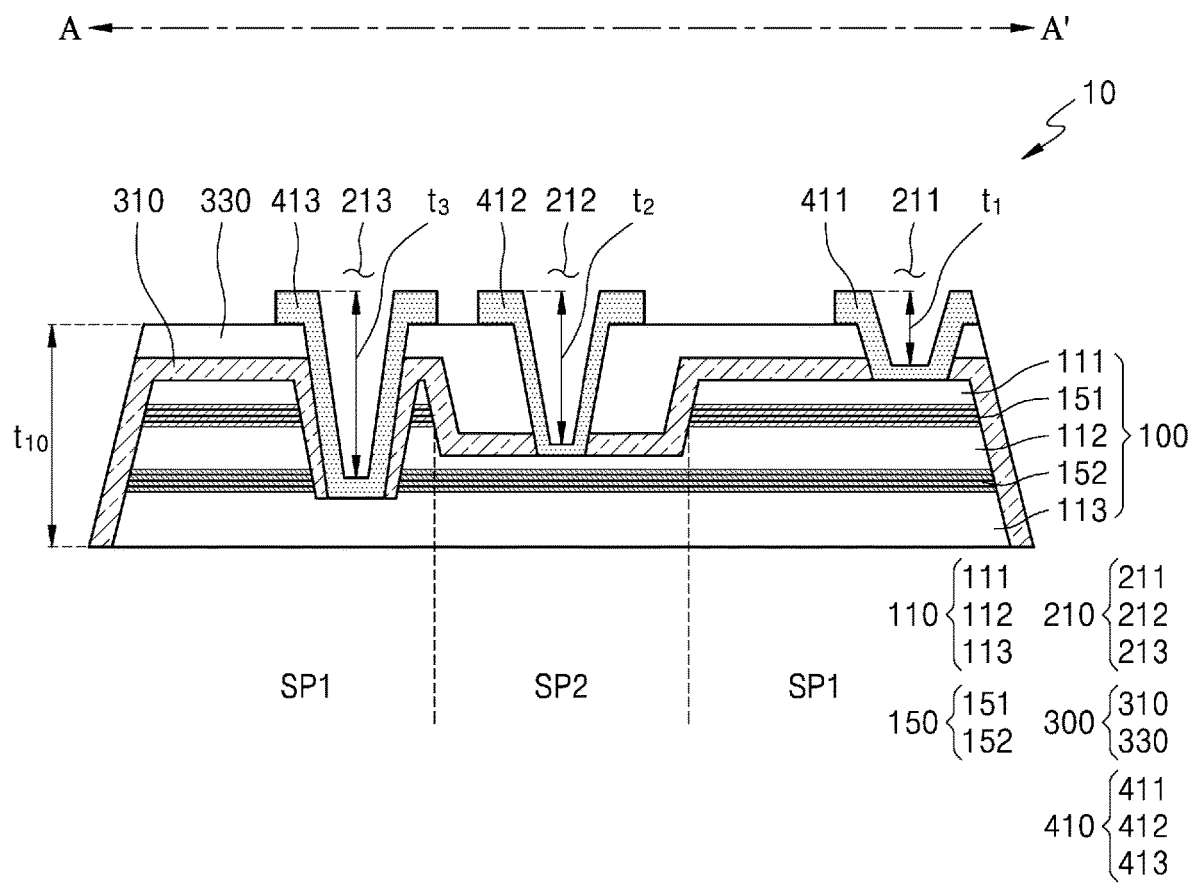
FIG. 2 is a cross-sectional view of the light-emitting device of FIG. 1, taken along line A-A'.

FIG. 1 is a plan view of a light-emitting device 10 according to an example embodiment, and FIG. 2 is a cross-sectional view of the light-emitting device 10 of FIG. 1, taken along line A-A'.

Referring to FIGS. 1 and 2, the light-emitting device 10 according to an example embodiment may include a light-emitting cell 100 including a first semiconductor layer 111, a first active layer 151 emitting first-color light, a second semiconductor layer 112, a second active layer 152 emitting second-color light, and a third semiconductor layer 113. According to an example embodiment, these components are sequentially arranged from the top in the above order. Moreover, the light-emitting device 10 may include an insulating layer 300 having a flat upper surface while covering the light-emitting cell 100, a first trench 211 exposing the first semiconductor layer 111 by penetrating through the insulating layer 300 and a partial area of the light-emitting cell 100, a second trench 212 exposing the second semiconductor layer 112 by penetrating through the insulating layer 300 and a partial area of the light-emitting cell 100, a first electrode 411 extending from the first semiconductor layer 111 to the upper surface of the insulating layer 300 along the first trench 211, a second electrode 412 extending from the second semiconductor layer 112 to the upper surface of the insulating layer 300 along the second trench 212, and a third electrode 413 in contact with the third semiconductor layer 113. The insulating layer 300 may include a first insulating layer 310 covering an upper surface of the light-emitting cell 100, side surfaces of the first trench 211, and side surfaces of the second trench 212, and a second insulating layer 330 arranged on the first insulating layer 310 and configured to reduce a difference between a height of the first electrode 411 and a height of the second electrode 412, wherein the height of the first electrode 411 and the height of the second electrode 412 may be substantially equal to a certain height from a lower surface of the light-emitting device 10, or a difference thereof may be within 10% of a thickness of the light-emitting device 10.

In addition, the light-emitting device 10 according to an example embodiment may further include a third trench 213 exposing the third semiconductor layer 113 by penetrating through the insulating layer 300 and a partial area of the light-emitting cell 100, and the third electrode 413 may extend from the third semiconductor layer 113 to the upper surface of the insulating layer 300 along the third trench 213.

When the height of the first electrode 411 and the height of the second electrode 412 of the light-emitting device 10 according to an example embodiment are substantially equal to each other, convenience of a transfer operation, a bonding operation, or the like may be increased, and accordingly, this may be advantageous for the manufacturing of a display apparatus. In addition, because the light-emitting device 10 according to an example embodiment may emit a plurality of colors of light, a degree of freedom for a design of a planar shape of a well and a planar shape of the light-emitting device 10 corresponding thereto may be increased when a transfer method by fluidic self-assembly is performed.

Hereinafter, the light-emitting device 10 is described in detail.

The light-emitting device 10 according to an example embodiment may include a light-emitting cell 100 including the first semiconductor layer 111, the first active layer 151 emitting the first-color light, the second semiconductor layer 112, the second active layer 152 emitting the second-color light, and the third semiconductor layer 113, and these components may be placed and arranged sequentially from top to bottom in the above order. At least one of the first semiconductor layer 111, the second semiconductor layer 112, and the third semiconductor layer 113 may include a group II-VI or group III-V compound semiconductor material. At least one of the first semiconductor layer 111, the second semiconductor layer 112, and the third semiconductor layer 113 may provide electrons and holes to an active layer 150. According to an example embodiment, the active layer 150 may include the first active layer 151 and the second active layer 152. To this end, the first semiconductor layer 111 may be doped n-type or p-type, and the second semiconductor layer 112 may be doped a conductivity type that is electrically opposite to that of the first semiconductor layer 111. The first semiconductor layer 111 and the third semiconductor layer 113 may be doped the same conductivity type. For example, the first semiconductor layer 111 may be doped p-type, and the second semiconductor layer 112 may be doped n-type. Alternatively, the first semiconductor layer 111 may be doped n-type, and the second semiconductor layer 112 may be doped p-type. When the second semiconductor layer 112 is doped n-type, for example, silicon (Si) may be used as a dopant, and when the first semiconductor layer 111 is doped p-type, for example, zinc (Zn) may be used as a dopant. At this time, the second semiconductor layer 112 doped n-type may provide electrons to the active layer 150, and the first semiconductor layer 111 doped p-type may provide holes to the active layer 150.

The active layer 150 has a quantum well structure in which quantum wells are arranged between barriers. In the active layer 150 arranged between two of semiconductor layers 110, electrons and holes provided by the two semiconductor layers 110 may recombine in the quantum well structure of the active layer 150, thereby emitting light. For example, electrons and holes provided by the first semiconductor layer 111 and the second semiconductor layer 112 may recombine in the quantum well structure of the first active layer 151, thereby emitting light. A wavelength of light generated by the active layer 150 may be determined according to a band gap of a material forming the quantum wells in the active layer 150. The active layer 150 may have a single quantum well structure, or may have a multi-quantum well (MQW) structure in which multiple quantum wells and a plurality of barriers are alternately arranged. A thickness of the active layer 150 or the number of quantum wells in the active layer 150 may be appropriately selected by considering a driving voltage, luminance efficiency, or the like of the light-emitting device 10 to be manufactured.

The active layer 150 may include a quantum barrier layer and a quantum well layer. For example, the quantum barrier layer may include gallium nitride (GaN), and the quantum well layer may include indium gallium nitride ($In_xGa_{1-x}N$ ($0 \le x \le 1$)). However, the disclosure is not limited thereto, and the quantum barrier layer or the quantum well layer may include various materials. The active layer 150 may have a structure in which quantum barrier layers and quantum well layers are alternately stacked N times (where N is a natural number equal to or greater than 1).

The light-emitting cell 100 shown in FIGS. 1 and 2 may be in the form of the light-emitting cell 100 using the second semiconductor layer 112 as a common semiconductor layer. That is, a voltage may be applied between the first semiconductor layer 111 and the second semiconductor layer 112 to emit the first-color light from the first active layer 151, and a voltage may be applied between the second semiconductor layer 112 and the third semiconductor layer 113 to emit the second-color light from the second active layer 152. The second semiconductor layer 112 commonly related to an emission of the first-color light and an emission of the second-color light may be referred to as a common semiconductor layer. The light-emitting cell 100 may include a portion associated with the emission of the first-color light and a portion associated with the emission of the second-color light. The portion associated with the emission of the first-color light may include the first semiconductor layer 111, the first active layer 151, and the second semiconductor layer 112, and the portion associated with the emission of the second-color light may include the second semiconductor layer 112, the second active layer 152, and the third semiconductor layer 113. The portion associated with the emission of the first-color light and the portion associated with the emission of the second-color light may include the second semiconductor layer 112 in common. By using the second semiconductor layer 112 as a common semiconductor layer, a separate bonding layer may not be included between the portion associated with the emission of the first-color light and the portion associated with the emission of the second-color light. For example, the first semiconductor layer 111 and the third semiconductor layer 113 may have the same polarity, and the second semiconductor layer 112 may have a polarity opposite to that of the first semiconductor layer 111. The first active layer 151 may be between the first semiconductor layer 111 and the second semiconductor layer 112, and the second active layer 152 may be between the second semiconductor layer 112 and the third semiconductor layer 113. The first active layer 151 may emit the first-color light, the second active layer 152 may emit the second-color light, and the first-color light and the second-color light may have different colors or different wavelengths from each other. The first semiconductor layer 111 may be electrically connected to the second semiconductor layer 112, and when a voltage is applied from the outside, the first-color light may be emitted by the first active layer 151. The second semiconductor layer 112 may be electrically connected to the third semiconductor layer 113, and when a voltage is applied from the outside, the second-color light may be emitted by the second active layer 152. The emission of the first-color light and the emission of the second-color light may be independent of each other. In other words, according to voltage application, only the first-color light may be emitted, only the second-color light may be emitted, or both the first-color light and the second-color light may be emitted. For example, the first-color light may be blue light B, and the second-color light may be green light G. The blue light B may have a wavelength of about 420 nm to about 495 nm, and the green light G may have a wavelength of about 495 nm to about 570 nm. However, the disclosure is not limited thereto, and color light of other colors or wavelengths may be emitted. For example, red light R may be emitted as one color light, and the red light R may have a wavelength of about 620 nm to about 750 nm. According another embodiment, the plurality of colors of light are not limited to the blue light B, the green light G, and/or the red light R, and may include violet light having a wavelength of about 380 nm to about 450 nm, cyan light having a wavelength of about 475 nm to about 510 nm, yellow light having a wavelength of about 565 nm to about 590 nm, and/or orange light having a wavelength of about 590 nm to about 620 nm. It may be preferred for an active layer arranged on a side far from a direction in which light exits to emit light having a longer wavelength than an active layer arranged on a side near the direction in which light exits. For example, when the direction in which light exits is an upper portion of the light-emitting device 10, a wavelength of the second-color light may be greater than a wavelength of the first-color light. When the direction in which light exits is a lower portion of the light-emitting device 10, the wavelength of the second-color light may be less than the wavelength of the first-color light.

According to an example embodiment, only the first active layer 151 or the second active layer 152 may be on a portion of a plane of the light-emitting cell 100 viewed from the top of the light-emitting device 10. For example, referring to FIGS. 1 and 2, only the second active layer 152 may be near a center of the light-emitting device 10, and an area in which only the second active layer 152 is arranged may be referred to as a second light-emitting plane SP2. The first active layer 151 and the second active layer 152 may be simultaneously arranged in a vicinity of edges except the center of the light-emitting device 10. An area in which the first active layer 151 is arranged, except for the second light-emitting plane SP2, may be referred to as a first light-emitting plane SP1. The first-color light and the second-color light may be emitted from the first light-emitting plane SP1, and only the second-color light may be emitted from the second light-emitting plane SP2. However, the disclosure is not limited thereto, and only the first active layer 151 may be arranged in the first light-emitting plane SP1, or only the first-color light may be emitted from the first light-emitting plane SP1. When two or more active layers 150 are arranged on one light-emitting plane, it may be for an active layer arranged on a side far from the direction in which light exits to emit light having a longer wavelength than an active layer arranged on a side near the direction in which light exits.

According to an example embodiment, the light-emitting device 10 may further include a distributed Bragg reflector (DBR) layer between the first active layer 151 and the second active layer 152. The DBR layer may be configured to allow the first-color light to be reflected to the upper portion of the light-emitting device 10 so that the first-color light emitted by the first active layer 151 is reabsorbed by the second active layer 152 and the second active layer 152 is not activated. The DBR layer may be configured to allow the second-color light to be transmitted through the upper portion of the light-emitting device 10. The DBR layer may have a multi-layer structure including a plurality of layers having the same height.

According to an example embodiment, each of the first trench 211, the second trench 212, and the third trench 213 of the light-emitting device 10 may penetrate through the insulating layer 300 and a partial area of the light-emitting cell 100 and have a certain depth. A partial area of the light-emitting cell 100, the partial area being penetrated by each trench 210, may be different. For example, the first trench 211 may penetrate through a partial area of the first semiconductor layer 111 or may penetrate through only the insulating layer 300 without penetrating through a partial area of the light-emitting cell 100. The second trench 212 may penetrate through a partial area of the second semiconductor layer 112 or may penetrate through only the insulating layer 300 without penetrating through a partial area of the light-emitting cell 100. The third trench 213 may penetrate through the first semiconductor layer 111, the first active layer 151, the second semiconductor layer 112, and the second active layer 152 and may further penetrate through a partial area of the third semiconductor layer 113. Each of the first trench 211, the second trench 212, and the third trench 213 may be indented from an upper surface of the light-emitting cell 100 in an inward direction of the light-emitting cell 100. Each of the first trench 211, the second trench 212, and the third trench 213 may be symmetric around a central axis of a plane of the light-emitting device 10, but is not limited thereto. According to an example embodiment, the second trench 212 may be at the center of the plane of the light-emitting device 10, but the disclosure is not limited thereto. As such, according to another example embodiment, the second trench 212 may be provided at location different from the center of the plane of the light-emitting device 10.

Each of the first trench 211, the second trench 212, and the third trench 213 may include side surfaces and a bottom surface. The side surfaces thereof may be parallel to a height direction of the light-emitting device 10 or may be inclined surfaces having an inclination angle with respect to the height direction of the light-emitting device 10. For example, when widths of a plurality of trenches 210 decrease away from the upper surface of the light-emitting cell 100, side surfaces of the plurality of trenches 210 may be inclined surfaces. In this case, an area of an active layer removed or etched by the trench 210 may be reduced, thereby increasing an emission area. When a depth of the trench 210 is less than a height of the light-emitting device 10, a bottom surface of the trench 210 may reach one semiconductor layer 110. The one semiconductor layer 110 may be the first semiconductor layer 111, the second semiconductor layer 112, or the third semiconductor layer 113. For example, the first trench 211 may have a certain depth $t_1$ penetrating through the insulating layer 300 to reach the first semiconductor layer 111, the second trench 212 may have a certain depth $t_2$ penetrating through the insulating layer 300 to reach the second semiconductor layer 112, the third trench 213 may have a certain depth $t_3$ penetrating through the insulating layer 300 and a partial area of the light-emitting cell 100 to reach the third semiconductor layer 113. It may be necessary to etch the insulating layer 300 to allow the first trench 211 to reach the first semiconductor layer 111. However, the disclosure is not limited thereto, and a portion of the first semiconductor layer 111 may also be etched together with the etching of the insulating layer 300. It may be necessary to etch the insulating layer 300 to allow the second trench 212 to reach the second semiconductor layer 112. However, the disclosure is not limited thereto, and a portion of the second semiconductor layer 112 may also be etched together with the etching of the insulating layer 300. To allow the third trench 213 to reach the third semiconductor layer 113, the third trench 213 may be formed by etching the insulating layer 300, the first semiconductor layer 111, the first active layer 151, the second semiconductor layer 112, and the second active layer 152. However, the disclosure is not limited thereto, and a portion of a thickness of the third semiconductor layer 113 may also be etched to form the third trench 213.

The light-emitting device 10 according to an example embodiment may include the insulating layer 300 having a flat upper surface while covering the light-emitting cell 100. The insulating layer 300 may include the first insulating layer 310 covering the upper surface of the light-emitting cell 100, the side surfaces of the first trench 211 and the side surfaces of the second trench 212, and the second insulating layer 330 arranged on the first insulating layer 310 and configured to reduce a difference between the height of the first electrode 411 and the height of the second electrode 412. The first insulating layer 310 is not limited to covering the side surfaces of the first trench 211 and the side surfaces of the second trench 212, and may also cover side surfaces of the plurality of trenches 210. The first insulating layer 310 may cover side surfaces of the light-emitting cell 100 as well as the upper surface of the light-emitting cell 100. By arranging the first insulating layer 310 to cover the side surfaces of the plurality of trenches 210, each of the plurality of trenches 210 may expose only one semiconductor layer 110, and one electrode 410 arranged in one trench 210 may be in electrical contact with only one semiconductor layer 110. For example, the first electrode 411 of the first trench 211 may be only in contact with the first semiconductor layer 111, the second electrode 412 of the second trench 212 may be only in contact with the second semiconductor layer 112, and the third electrode 413 of the third trench 213 may be only in contact with the third semiconductor layer 113. The first insulating layer 310 may include an oxide or the like, and the insulating layer 300 may include a light-transmitting material. The light-transmitting material may be transparent, and for example, a light transmittance thereof may be substantially equal to 85% or greater than about 85%. The light-transmitting material may be a material having a light transmittance greater than 85%. In addition, the light-transmitting material may be a material having a difference in transmittance of less than 10% in an entire visible light spectrum to reduce color distortion. In addition, the light-transmitting material may include a transparent material.

The first electrode 411 of the light-emitting device 10 according to an example embodiment may extend from the first semiconductor layer 111 to the upper surface of the insulating layer 300 along the first trench 211, and the second electrode 412 may extend from the second semiconductor layer 112 to the upper surface of the insulating layer 300 along the second trench 212. The upper surface of the insulating layer 300 may mean an upper surface of the light-emitting device 10, but is not limited thereto.

One of a plurality of electrodes 410 may be in electrical contact with only one of a plurality of semiconductor layers 110. At least one of the first electrode 411, the second electrode 412, and the third electrode 413 may include a light-transmitting material, and for example, a material of at least one of the first electrode 411, the second electrode 412, and the third electrode 413 may be indium tin oxide (ITO) or the like. The light-transmitting material may be transparent, and for example, a light transmittance thereof may be substantially equal to 85% or greater than about 85%.

Each of the first electrode 411, the second electrode 412, and the third electrode 413 may be arranged to extend along a corresponding trench 210 on the bottom surface and side surfaces of the trench 210. A portion of each of the first electrode 411, the second electrode 412, and the third electrode 413 may be arranged on the insulating layer 300 or the upper surface of the light-emitting device 10 by extending to a vicinity or outside the corresponding trench 210. Alternatively, each of the first electrode 411, the second electrode 412, and the third electrode 413 may extend onto the upper surface of the light-emitting device 10. However, the electrode 410 is not limited to being arranged on the trench 210, and one of the first electrode 411, the second electrode 412, and the third electrode 413 may also be arranged below the light-emitting device 10.

The first electrode 411 and the third electrode 413 may have the same polarity, and the second electrode 412 may have a polarity opposite to the polarity of the first electrode 411 and the third electrode 413. For example, when the first semiconductor layer 111 and the third semiconductor layer 113 are n-type and the second semiconductor layer 112 is p-type, the first electrode 411 and the third electrode 413 may be n-type electrodes, and the second electrode 412 may be a p-type electrode.

A portion of each of the first electrode 411, the second electrode 412, and the third electrode 413, the portion being arranged outside the corresponding trench 210, may be arranged on the first insulating layer 310 or the second insulating layer 330 by extending to the top of the insulating layer 300. For example, a portion of the first electrode 411 may be arranged on the first insulating layer 310, and a portion of the third electrode 413 may also be arranged on the first insulating layer 310. At this time, a portion of the first insulating layer 310, the portion having the above portion of the first electrode 411 arranged thereon, and a portion of the first insulating layer 310, the portion having the above portion of the third electrode 413 arranged thereon, may be at a certain height $t_{10}$ substantially equal to each other based on a lower surface of the light-emitting device 10. Alternatively, a portion of the third electrode 413 may also be on the second insulating layer 330. A portion of the second electrode 412 may be on the second insulating layer 330. However, the disclosure is not limited thereto, and the above portion of the first electrode 411 and the above portion of the third electrode 413 may also be arranged at different heights from each other. In this case, to reduce a difference between a height of an electrode arranged at a higher height and a height of an electrode arranged at a lower height, the second insulating layer 330 may be additionally arranged below or on side surfaces of the electrode arranged at a lower height or the second insulating layer 330 having a greater thickness may be arranged. Referring to FIGS. 1 and 2, a portion of the first electrode 411, the portion extending to the outside of the first trench 211, and a portion of the third electrode 413, the portion extending to the outside of the third trench 213, may each be arranged on the second insulating layer 330, and a partial height of the second insulating layer 330 on which a portion of the first electrode 411 is positioned and a partial height of the second insulating layer 330 on which a portion of the third electrode 413 is positioned may be substantially the same with respect to the lower surface of the light-emitting device 10. The second insulating layer 330 on which a portion of the first electrode 411 is arranged, the portion extending to the outside of the first trench 211, may have a different height from the first insulating layer 310 on which a portion of the second electrode 412 is arranged, the portion extending to the outside of the second trench 212, and thus, the second insulating layer 330 may be arranged below the second electrode 412 and/or between the second electrode 412 and the first electrode 411, and or the second insulating layer 330 may be arranged between the second electrode 412 and the third electrode 413. Accordingly, a portion of the second electrode 412, the portion extending to the outside of the second trench 212, may be arranged on the second insulating layer 330. The second insulating layer 330 may adjust a height at which the second electrode 412 may be arranged, and a height of a portion of the second electrode 412 (e.g., the portion extending to the outside of the second trench 212) may be adjusted by the second insulating layer 330 to have a height substantially equal to or almost similar to a height of a portion of the first electrode 411 (e.g., the portion extending to the outside of the first trench 211) and a height of a portion of the third electrode 413 (e.g., the portion extending to the outside of the third trench 213). The height may be substantially equal to the certain height $t_{10}$ from the lower surface of the light-emitting device 10 based on the lower surface of the light-emitting device 10. A partial height of each of the first electrode 411, the second electrode 412, and the third electrode 413 is not limited to being substantially equal to the certain height $t_{10}$, the partial height of each of the first electrode 411, the second electrode 412, and the third electrode 413 may have a difference of about 10% or less of a thickness of the light-emitting device 10 with the certain height $t_{10}$, and the electrode 410 may be arranged. For example, the partial height of each of the first electrode 411, the second electrode 412, and the third electrode 413 may have a difference of about 5% or less of the thickness of the light-emitting device 10 with the certain height $t_{10}$.

The second insulating layer 330 of the light-emitting device 10 according to an example embodiment may be arranged below one electrode 410 or between the plurality of electrodes 410 to reduce a height difference of each portion between the plurality of electrodes 410. For example, to reduce a height difference between a portion of the first electrode 411, the portion extending to the outside of the first trench 211, and a portion of the second electrode 412, the portion extending to the outside of the second trench 212, the second insulating layer 330 may be arranged below an electrode having a lower height from among the first electrode 411 and the second electrode 412 or between the first electrode 411 and the second electrode 412. Because a portion of each of the plurality of electrodes 410 (a portion extending to the outside of a corresponding trench 210) may be arranged at a substantially equal height through the second insulating layer 330, accordingly, convenience in operations such as transfer and bonding operations may be increased, and this may be an advantage for the manufacturing of a display apparatus.

The second insulating layer 330 may be substantially the same as or different from the first insulating layer 310. The second insulating layer 330 may be arranged through spin coating or the like. The second insulating layer 330 may include an oxide, an insulator, or the like. The second insulating layer 330 may be a light-transmitting material via which color light may pass to the second insulating layer 330. The light-transmitting material may be a material having a light transmittance that is substantially equal to 85% or greater than about 85%. In addition, the light-transmitting material may be a material having a difference in transmittance of less than 10% in an entire visible light spectrum to reduce color distortion. In addition, the light-transmitting material may include a transparent material.

The light-emitting device 10 according to an example embodiment may be rotationally symmetric with respect to at least one angle. However, the disclosure is not limited thereto, and there may be no angle forming the rotational symmetry. For example, the light-emitting device 10 may have a circular, elliptical, or polygonal planar shape.

Compared to the related art of transferring a light-emitting device emitting three different colors of light and having three different planar shapes to a well of a corresponding substrate to realize full color, the light-emitting device 10 according to an example embodiment may emit a plurality of colors of light, so that a degree of freedom of a planar shape design of the light-emitting device 10 may be increased. For example, when the light-emitting device 10 according to an example embodiment may emit the green light G and the blue light B, the light-emitting device 10 may implement full color together with another light-emitting device capable of emitting the red light R. As described above, because the full color may be realized through two types of light-emitting devices instead of three different types of light-emitting devices, when transferring a plurality of light-emitting devices including the light-emitting device 10 according to an example embodiment by a fluidic self-assembly (FSA) transfer method, a degree of freedom of a design of a well shape and a planar shape of a light-emitting device may be increased. In addition, through the second insulating layer 330, a height of the electrode 410 or a portion (a portion extending to the outside of the corresponding trench 210) of the electrode 410 arranged in the light-emitting device 10 may be substantially equal or almost similar. Accordingly, an operation such as transfer or bonding may be facilitated, and favorable conditions may be created when manufacturing a display apparatus. In addition, because one pixel may be configured with two light-emitting devices, the number of light-emitting devices may be reduced compared to manufacturing a display by configuring one pixel with at least three light-emitting devices, thereby lowering a manufacturing cost. The light-emitting device 10 according to an example embodiment and another light-emitting device, which may configure one pixel, may have the same thickness or different thicknesses. To compensate for a thickness difference thereof when arranged on a substrate, that is, to make heights at which the two light-emitting devices arranged in substrate wells are substantially equal or almost similar with respect to a lower surface of the substrate, a depth of a well corresponding to each light-emitting device may also be adjusted. This will be described below in more detail. However, as in the above embodiment, the light-emitting device 10 may emit two colors of light, but is not limited thereto, and may also emit three or more colors of light.

Figure 3:
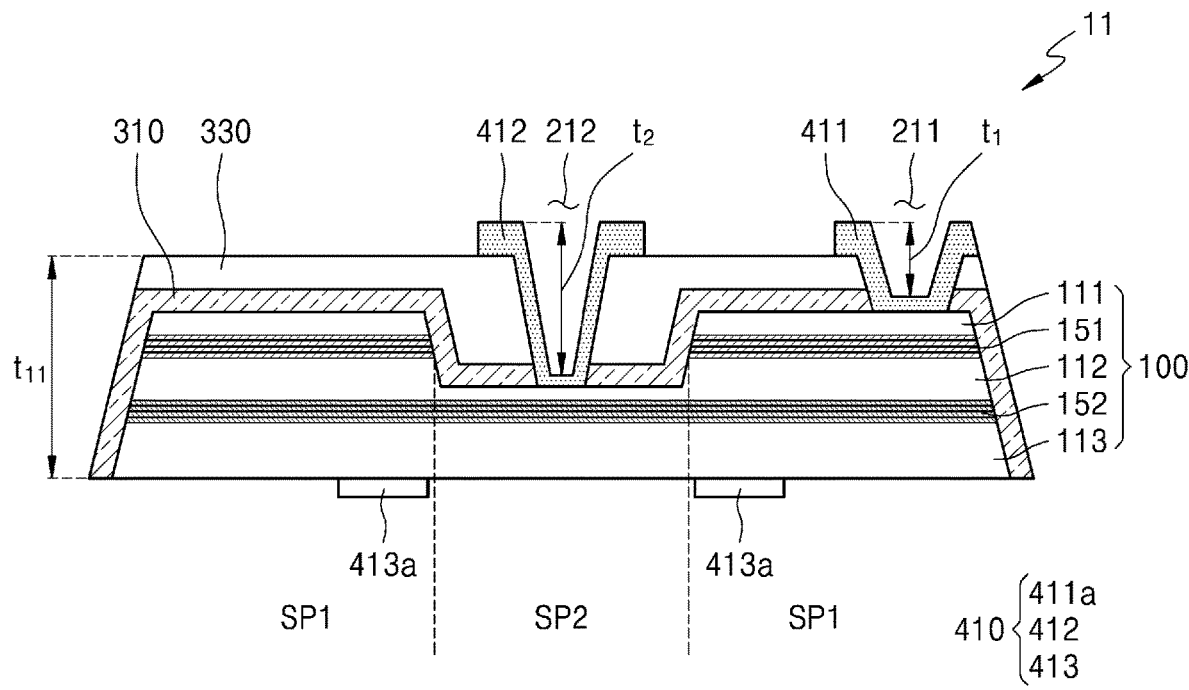
FIG. 3 is a cross-sectional view of a light-emitting device according to an example embodiment.

FIG. 3 is a cross-sectional view of a light-emitting device 11 according to another example embodiment.

In the light-emitting device 11 according to an example embodiment, one of the first electrode 411 and a third electrode 413a may be arranged on a corresponding trench 210, and the other one of the first electrode 411 and a third electrode 413a may be arranged in contact with a lower surface of the light-emitting device 11. The second electrode 412 may be on the second trench 212. At this time, an electrode arranged on the lower surface of the light-emitting device 11 may be stated to have a vertical electrode structure with the second electrode 412, and an electrode arranged on the trench 210 may be stated to have a horizontal electrode structure with the second electrode 412. However, the disclosure is not limited thereto, and the third electrode 413a may be arranged on the lower surface of the light-emitting device 11 along a trench penetrating through the light-emitting device 11, or the second electrode 412 may be arranged on the lower surface of the light-emitting device 11 along a trench penetrating through the light-emitting device 11. Referring to FIG. 3, the third electrode 413a may be arranged on the lower surface of the light-emitting device 11. The third electrode 413a may have a planar shape such as a ring, a circle, an ellipse, or a polygon. The third electrode 413a arranged on the lower surface of the light-emitting device 11 may directly contact the third semiconductor layer 113. Because the third electrode 413a is arranged on the lower surface of the light-emitting device 11, the third trench 213 may not be formed. The third electrode 413a and the second electrode 412 may have the vertical electrode structure. The second electrode 412 may be arranged on the second trench 212, and a height of a portion of the second electrode 412, the portion extending to the outside of the second trench 212, and a height of a portion of the first electrode 411, the portion extending to the outside of the first trench 211, may be substantially equal based on the lower surface of the light-emitting device 11.

In other words, the height of the above portion of the first electrode 411 and the height of the above portion of the second electrode 412 may be substantially equal to or almost similar to a certain height $t_{11}$. The first electrode 411 and the second electrode 412 may have the horizontal electrode structure. An electrode arranged in the vertical electrode structure may be an electrode corresponding to a semiconductor layer close to the lower surface of the light-emitting device 11 among the semiconductor layers 110. In this case, the electrode corresponding to the semiconductor layer close to the lower surface of the light-emitting device 11 among the semiconductor layers 110 may be arranged on the lower surface without a trench.

Figure 4:
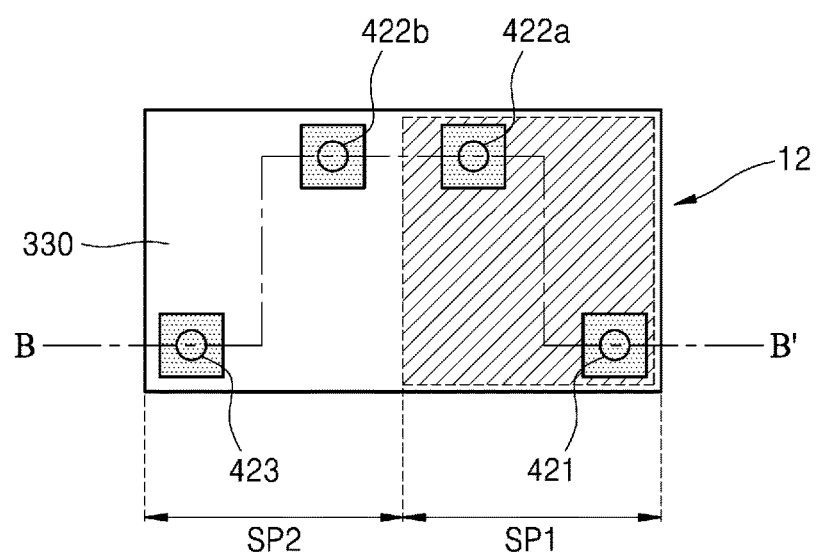
FIG. 4 is a plan view of a light-emitting device according to an example embodiment.
Figure 5A:
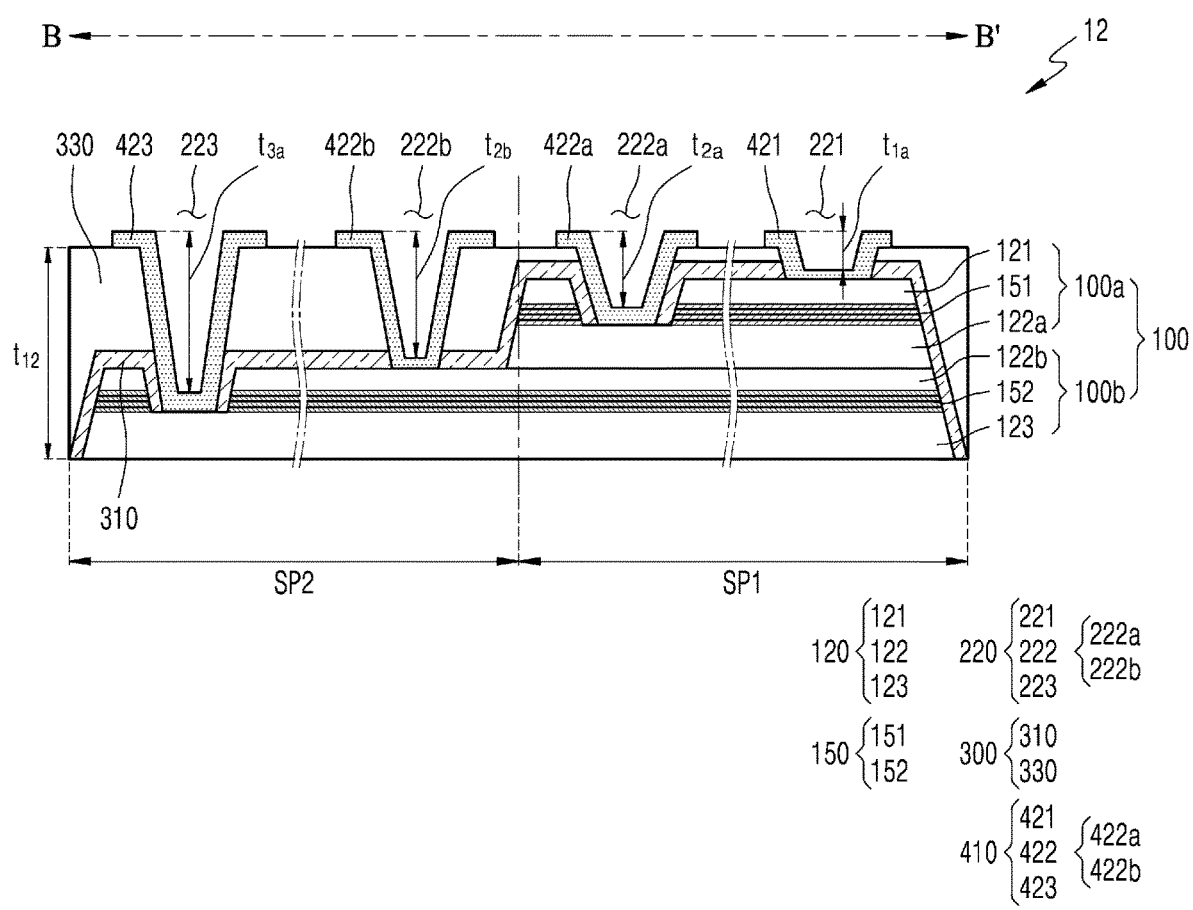
FIG. 5A is a cross-sectional view of the light-emitting device of FIG. 4, taken along line B-B'.
Figure 5B:
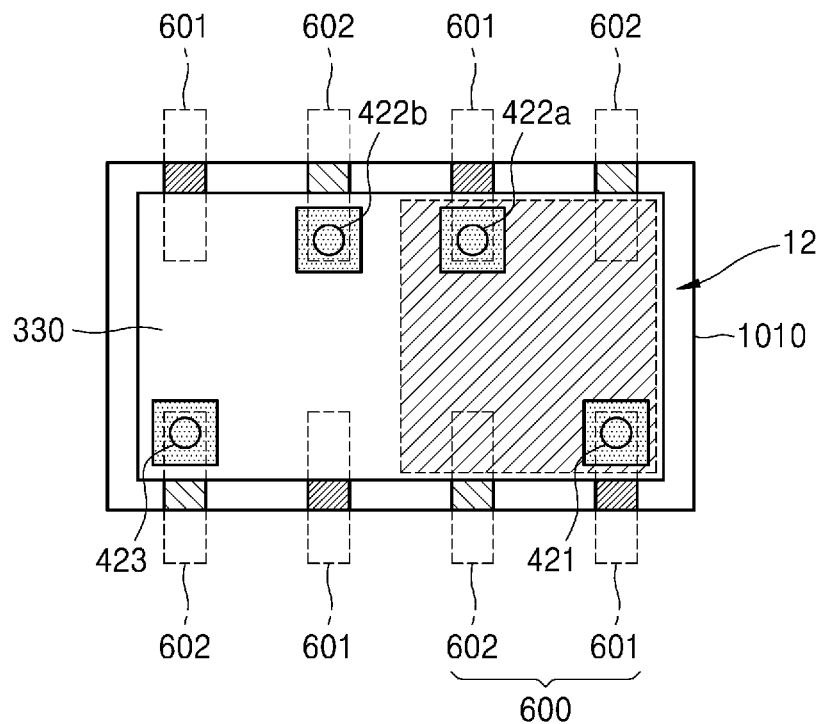
FIG. 5B is a diagram illustrating that the light-emitting device of FIG. 5A is inserted into a well of a substrate.
Figure 5C:
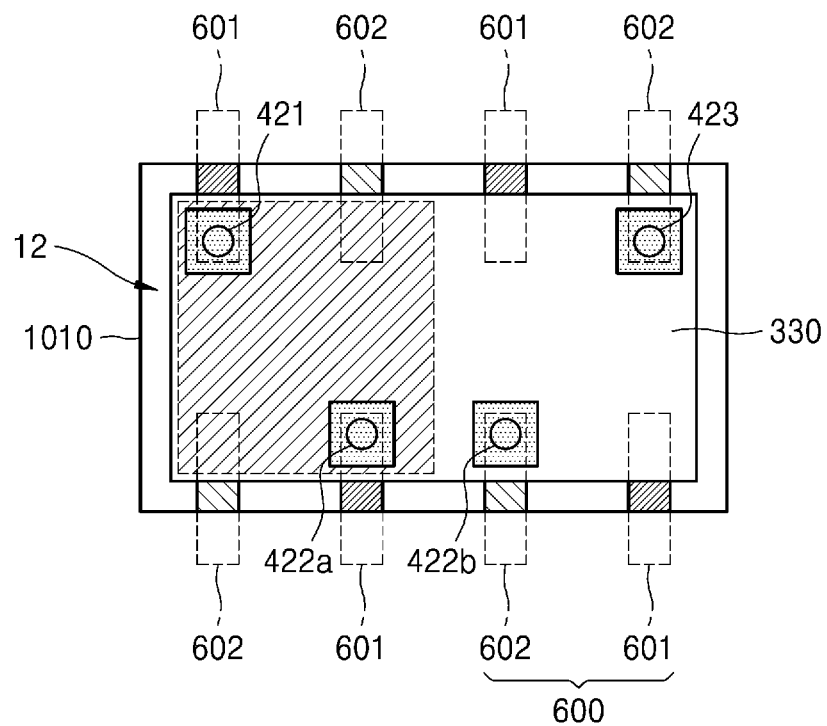
FIG. 5C is a diagram illustrating that the light-emitting device of FIG. 5A is rotated 180 degrees and inserted into a well of a substrate.

FIG. 4 is a plan view of a light-emitting device 12 according to an example embodiment, FIG. 5A is a cross-sectional view of the light-emitting device 12 of FIG. 4, taken along line B-B'; FIG. 5B is a diagram illustrating that the light-emitting device 12 of FIG. 4 is inserted into a well of a substrate; and FIG. 5C is a diagram illustrating that the light-emitting device 12 of FIG. 4 is rotated 180 degrees and inserted into a well of a substrate.

Referring to FIGS. 4 and 5A, a second semiconductor layer 122 of the light-emitting device 12 according to an example embodiment may include a first sub-semiconductor layer 122a and a second sub-semiconductor layer 122b below the first sub-semiconductor layer 122a, the second trench 222 may include first sub-trench 222a and a second sub-trench 222b, which are spaced apart from each other, and the second electrode 422 may include a first sub-electrode 422a and a second sub-electrode 422b, which are spaced apart from each other. The first sub-trench 222a may expose the first sub-semiconductor layer 122a by penetrating through the insulating layer 300 and a partial area of the light-emitting cell 100, and the second sub-trench 222b may expose the second sub-semiconductor layer 122b by penetrating through the insulating layer 300. The first sub-trench 222a may penetrate through a first semiconductor layer 121 and the first active layer 151, and may additionally penetrate through a portion of a thickness of the first sub-semiconductor layer 122a. The second sub-trench 222b may also penetrate through a portion of a thickness of the second sub-semiconductor layer 122b, in addition to the insulating layer 300. Accordingly, the light-emitting cell 100 may include the first semiconductor layer 121, the first active layer 151, the first sub-semiconductor layer 122a, the second sub-semiconductor layer 122b, the second active layer 152, and a third semiconductor layer 123, and these components may be placed or arranged sequentially from the top in the above order. The first semiconductor layer 121 may be electrically connected to the first sub-semiconductor layer 122a, and when a voltage is applied, the first-color light may be emitted by the first active layer 151. The second sub-semiconductor layer 122b may be electrically connected to the third semiconductor layer 123, and when a voltage is applied, the second-color light may be emitted by the second active layer 152. The first-color light and the second-color light may be emitted independently of each other. That is, the light-emitting device 12 according to an example embodiment may emit only the first-color light, may emit only the second-color light, or may also emit both the first-color light and the second-color light.

The second sub-semiconductor layer 122b may have a greater width than that of the first sub-semiconductor layer 122a. A portion of the light-emitting cell 100 including the first semiconductor layer 121, the first active layer 151, and the first sub-semiconductor layer 122a may be referred to as a first light-emitting cell 100a, and a portion of the light-emitting cell 100 including the second sub-semiconductor layer 122b, the second active layer 152, and the third semiconductor layer 123 may be referred to as a second light-emitting cell 100b. The second light-emitting cell 100b may have a greater width than that of the first light-emitting cell 100a.

Only the first active layer 151 or the second active layer 152 may be arranged on a portion of a plane of the light-emitting cell 100 viewed from the top of the light-emitting device 12. Referring to FIGS. 4 and 5A, only the second active layer 152 may be arranged on the left half of the light-emitting device 12, and an area in which only the second active layer 152 is arranged may be referred to as the second light-emitting plane SP2. The first active layer 151 and the second active layer 152 may be simultaneously arranged on the right half of the light-emitting device 12. An area in which the first active layer 151 is arranged, except for the second light-emitting plane SP2, may be referred to as the first light-emitting plane SP1. The first-color light and the second-color light may be emitted from the first light-emitting plane SP1, and only the second-color light may be emitted from the second light-emitting plane SP2. However, the disclosure is not limited thereto, and the first light-emitting plane SP1 may be wider or narrower (that is, the second light-emitting plane SP2 may be narrower or wider), or only the first active layer 151 may be arranged in the first light-emitting plane SP1. When two or more active layers 150 are arranged on one light-emitting plane, it may be for an active layer arranged on a side far from the direction in which light exits to emit light having a longer wavelength than an active layer arranged on a side near the direction in which light exits.

The DBR layer may be arranged between the first active layer 151 and the second active layer 152. The DBR layer may be configured to allow the first-color light emitted by the first active layer 151 to be reflected, and may also be configured to allow the second-color light emitted by the second active layer 152 to pass through. The first sub-semiconductor layer 122a and the second sub-semiconductor layer 122b may be in contact with each other, but are not limited thereto, and the DBR layer may also be arranged between the first sub-semiconductor layer 122a and the second sub-semiconductor layer 122b.

Referring to FIGS. 4 and 5A, the light-emitting device 12 according to an example embodiment may include a first trench 221, the first sub-trench 222a, the second sub-trench 222b, and a third trench 223. For example, the first trench 221 may have a certain depth $t_{1a}$ reaching the first semiconductor layer 121 to expose the first semiconductor layer 121, the first sub-trench 222a may have a certain depth tea reaching the first sub-semiconductor layer 122a to expose the first sub-semiconductor layer 122a, the second sub-trench 222b may have a certain depth $t_{2b}$ reaching the second sub-semiconductor layer 122b to expose the second sub-semiconductor layer 122b, and the third trench 223 may have a certain depth $t_{3a}$ reaching the third semiconductor layer 123 to expose the third semiconductor layer 123.

A first electrode 421, the first sub-electrode 422a, the second sub-electrode 422b, and a third electrode 423 of the light-emitting device 12 may each extend to the upper surface of the insulating layer 300 along a corresponding trench 220 while in contact with a corresponding semiconductor layer 120. Sidewalls of the trench 220 may be insulated by the first insulating layer 310. Referring to FIGS. 4 and 5A, because heights of the first light-emitting cell 100a and the second light-emitting cell 100b are different from each other with respect to a lower surface of the light-emitting device 12, the second insulating layer 330 may be arranged to reduce a difference between heights of the first trench 221 and the first sub-trench 222a arranged in the first light-emitting cell 100a and between heights of the second sub-trench 222b and the third trench 223 arranged in the second light-emitting cell 100b, that is, to make heights of a plurality of trenches 220 to be substantially equal with respect to the lower surface of the light-emitting device 12. A portion of each of the first electrode 421, the first sub-electrode 422a, the second sub-electrode 422b, and the third electrode 423 (e.g., the portion extending to the outside of the corresponding trench 220) may be arranged to be substantially equal to a certain height $t_{12}$ from the lower surface of the light-emitting device 12 or have a height difference of about 10% or less of a thickness of the light-emitting device 12 with the certain height $t_{12}$.

The light-emitting device 12 according to an example embodiment may have a rectangular planar shape, as shown in FIG. 4. However, the light-emitting device 12 is not limited thereto, and may have various shapes.

Referring to FIGS. 5B and 5C, the light-emitting device 12 shown in FIG. 4 may be arranged in a well 1010 of a substrate. A planar shape of the light-emitting device 12 may have a rectangular shape, the left half of a plane of the light-emitting device 12 may be the second light-emitting plane SP2, and the right half of the plane of the light-emitting device 12 may be the first light-emitting plane SP1. At this time, the first trench 221 and the first sub-trench 222a may be in the first light-emitting plane SP1, and the second sub-trench 222b and the third trench 223 may be in the second light-emitting plane SP2. A corresponding electrode 420 may be arranged in each trench 220. In the light-emitting device 12, a position of the first trench 221 and a position of the first sub-trench 222a, and a position of the second sub-trench 222b and a position of the third trench 223 may be rotationally asymmetric with respect to a tangent line between the first light-emitting plane SP1 and the second light-emitting plane SP2. Alternatively, in the light-emitting device 12, a position of the first electrode 421 and a position of the first sub-electrode 422a, and a position of the second sub-electrode 422b and a position of the third electrode 423 may be rotationally asymmetric with respect to a tangent line between the first light-emitting plane SP1 and the second light-emitting plane SP2. In other words, the position of the first electrode 421 may not overlap the position of the second sub-electrode 422b or the position of the third electrode 423 when being rotated 180 degrees with respect to a center of the tangent line, and the position of the first sub-electrode 422a may also not overlap the position of the second sub-electrode 422b or the position of the third electrode 423 when the tangent line is rotated by a particular angle. Referring to FIG. 5B, when the light-emitting device 12 is arranged in the well 1010 of the substrate in one direction, the position of the first electrode 421 and the position of the first sub-electrode 422a may not overlap the position of the second sub-electrode 422b and the position of the third electrode 423 of the light-emitting device 12 arranged in the well 1010 of the substrate in a direction rotated by 180 degrees in the one direction as shown in FIG. 5C. As described above, when the positions of the first electrode 421 and the first sub-electrode 422a and the positions of the second sub-electrode 422b and the third electrode 423 are rotationally asymmetric with respect to an angle of 180 degrees, even when the light-emitting device is inserted by being rotated 180 degrees, the first electrode 421 and the first sub-electrode 422a of the first light-emitting plane SP1 may be connected to an electrode pad 601 corresponding to the first light-emitting plane SP1, and the second sub-electrode 422b and the third electrode 423 of the second light-emitting plane SP2 may be connected to an electrode pad 602 corresponding to the second light-emitting plane SP2. On the other hand, when the positions of the first electrode 421 and the first sub-electrode 422a and the positions of the second sub-electrode 422b and the third electrode 423 are rotationally symmetric with respect to an angle of 180 degrees, when the light-emitting device 12 is inserted by being rotated 180 degrees, the first electrode 421 and the first sub-electrode 422a of the first light-emitting plane SP1 may be connected to the electrode pad 602 corresponding to the second light-emitting plane SP2, and the second sub-electrode 422b and the third electrode 423 of the second light-emitting plane SP2 may be connected to the electrode pad 601 corresponding to the first light-emitting plane SP1, which may cause a problem in electrical connections and color implementation.

An electrode pad 600 of a driving layer may be embedded in the well 1010 of the substrate. The electrode pad 600 of the driving layer may include the electrode pad 601 corresponding to the first light-emitting plane SP1, and the electrode pad 602 corresponding to the second light-emitting plane SP2. The electrode pad 600 of the driving layer may be rotationally symmetric with respect to a tangent line between the first light-emitting plane SP1 and the second light-emitting plane SP2. In such a case, in both two cases in which the first light-emitting plane SP1 of the light-emitting device 12 is transferred and arranged on a right side of the well 1010 (e.g., FIG. 5B) and in which the first light-emitting plane SP1 of the light-emitting device 12 is transferred and arranged on a left side of the well 1010 (e.g., FIG. 5C), the first electrode 421 and the first sub-electrode 422a of the first light-emitting plane SP1 may be connected to the electrode pad 601 corresponding to the first light-emitting plane SP1, and the second sub-electrode 422b and the third electrode 423 of the second light-emitting plane SP2 may be connected to the electrode pad 602 corresponding to the second light-emitting plane SP2.

Figure 6:
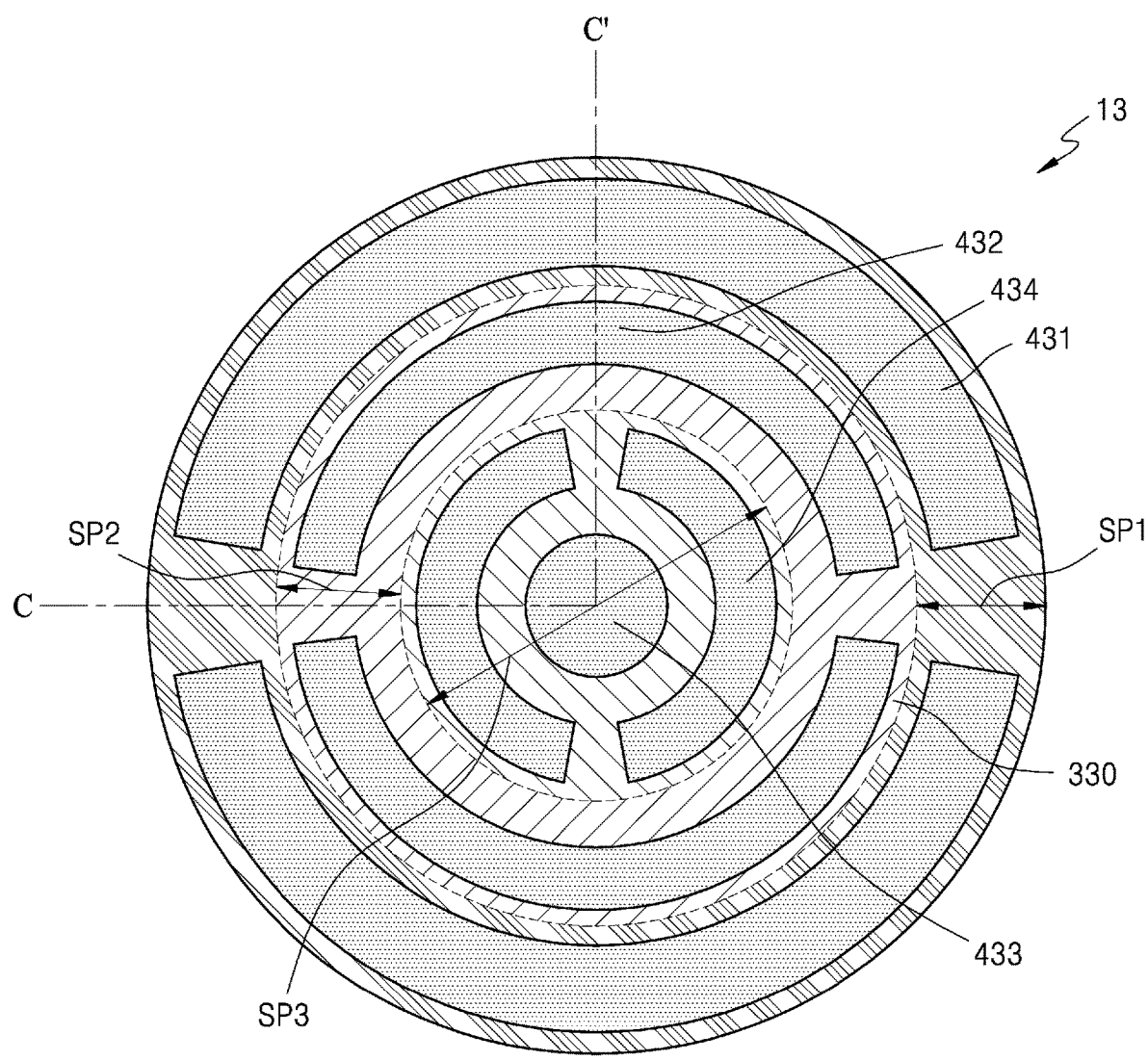
FIG. 6 is a plan view of a light-emitting device according to an example embodiment.
Figure 7:
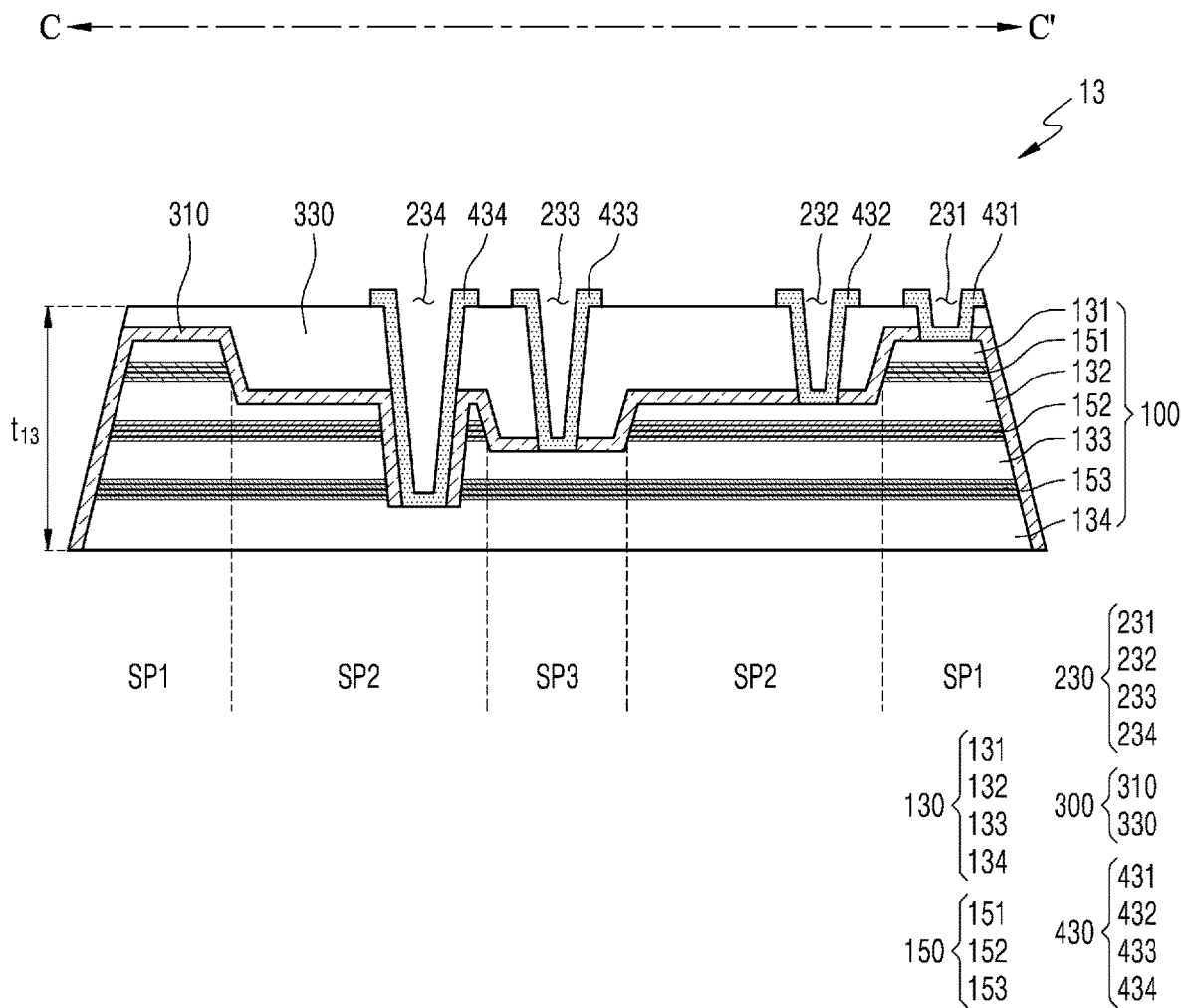
FIG. 7 is a cross-sectional view of the light-emitting device of FIG. 6, taken along line C-C'.
Figure 8:
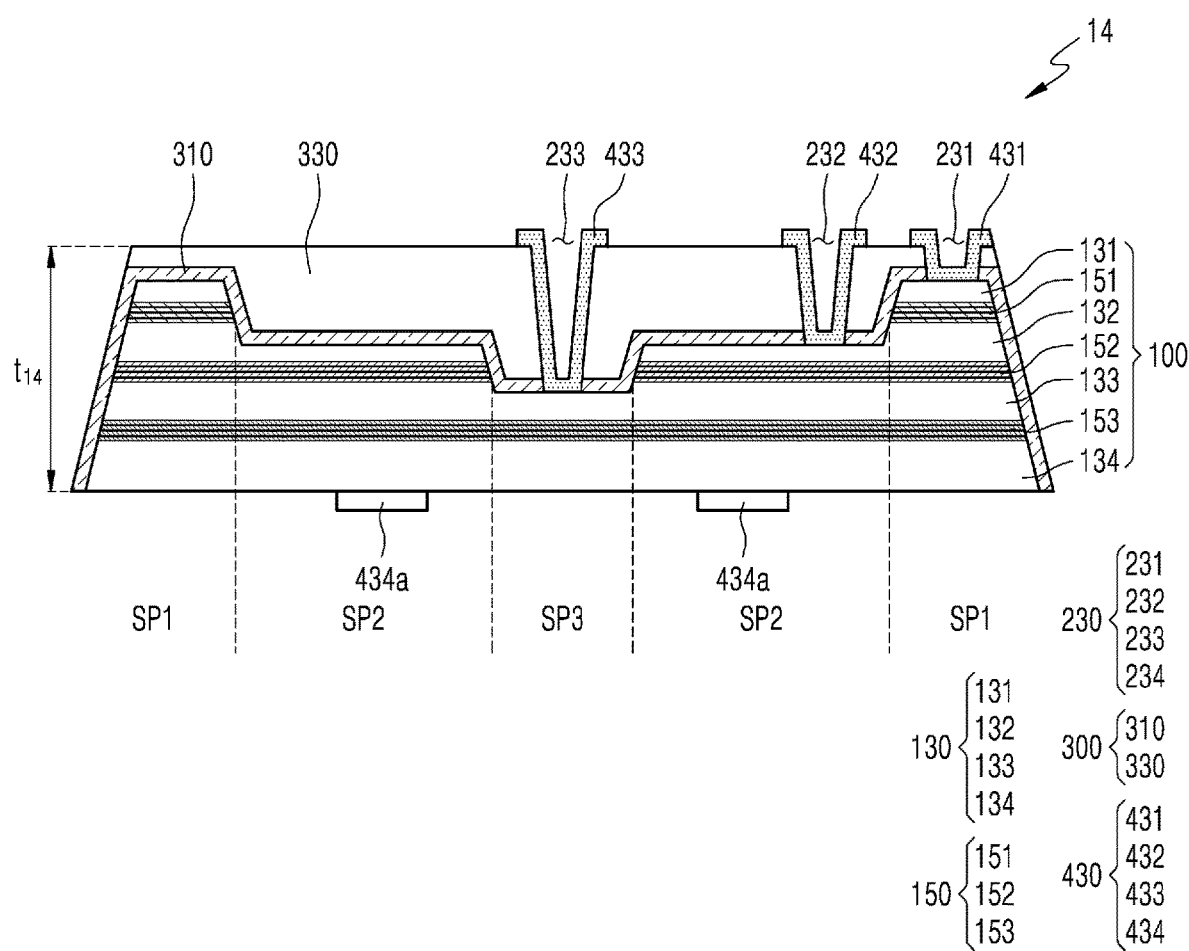
FIG. 8 is a cross-sectional view of a light-emitting device according to an example embodiment.

FIG. 6 is a plan view of a light-emitting device 13 according to an example embodiment, FIG. 7 is a cross-sectional view of the light-emitting device 13 of FIG. 6, taken along line C-C', and FIG. 8 is a cross-sectional view of a light-emitting device 14 according to an example embodiment.

The light-emitting devices 10, 11, 12, and 13 according to example embodiments may emit two colors or light, and the light-emitting device 13 according to an example embodiment according to FIGS. 6 and 7 may emit three colors of light. The light-emitting device 13 may include four semiconductor layers 130 and three active layers 150 between two adjacent semiconductor layers of the four semiconductor layers 130. When three colors of light are the red light R, the green light G, and the blue light B, the light-emitting device 13 may form one pixel. The light-emitting cell 100 of the light-emitting device 13 may include a first semiconductor layer 131, the first active layer 151, a second semiconductor layer 132, the second active layer 152, a third semiconductor layer 133, a third active layer 153, and a fourth semiconductor layer 134, and these components may be placed or arranged sequentially from the top in the above order. The first semiconductor layer 131 may have the same polarity as that of the third semiconductor layer 133. The second semiconductor layer 132 may have a polarity opposite to that of the first semiconductor layer 131, and may have the same polarity as that of the fourth semiconductor layer 134. When a voltage is applied between the first semiconductor layer 131 and the second semiconductor layer 132, the first-color light may be emitted by the first active layer 151. When a voltage is applied between the second semiconductor layer 132 and the third semiconductor layer 133, the second-color light may be emitted by the second active layer 152. When a voltage is applied between the third semiconductor layer 133 and the fourth semiconductor layer 134, third-color light may be emitted by the third active layer 153. Because the second semiconductor layer 132 is related to emissions of the first-color light and the second-color light, the second semiconductor layer 132 may be a common semiconductor layer. Because the third semiconductor layer 133 is related to emissions of the second-color light and the third-color light, the third semiconductor layer 133 may be a common semiconductor layer. For example, the first-color light may be the blue light B, the second-color light may be the green light G, and the third-color light may be red light R. It may be preferred for an active layer arranged on a side far from a direction in which light exits to emit light having a longer wavelength than an active layer arranged on a side near the direction in which light exits. For example, color light emitted by the second active layer 152 may have a longer wavelength than that of color light emitted by the first active layer 151, and color light emitted from the third active layer 153 may have a longer wavelength than that of color light emitted by the second active layer 152.

A first DBR layer may be arranged between the first active layer 151 and the second active layer 152, and/or a second DBR layer may be arranged between the second active layer 152 and the third active layer 153. The first DBR layer may be configured to allow the first-color light emitted by the first active layer 151 to be reflected, and may be configured to allow the second-color light emitted by the second active layer 152 to pass through. The second DBR layer may be configured to allow the second-color light emitted by the second active layer 152 to be reflected, and may be configured to allow the third-color light emitted by the third active layer 153 to pass through.

Only one of the first active layer 151, the second active layer 152, and the third active layer 153 may be arranged on a portion of a plane of the light-emitting cell 100 viewed from the top of the light-emitting device 13. Referring to FIGS. 6 and 7, only the third active layer 153 may be arranged near a center of the light-emitting device 13, and an area in which only the third active layer 153 is arranged may be referred to as a third light-emitting plane SP3. An area in which the second active layer 152 is arranged without the first active layer 151, except for the third light-emitting plane SP3, may be referred to as the second light-emitting plane SP2. Except for the second light-emitting plane SP2 and the third light-emitting plane SP3, an area in which the first active layer 151 is arranged may be referred to as the first light-emitting plane SP1. The first-color light, the second-color light, and the third-color light may be emitted from the first light-emitting plane SP1, the second-color light and the third-color light may be emitted from the second light-emitting plane SP2, and only the third-color light may be emitted from the third light-emitting plane SP3. However, the disclosure is not limited thereto, and various changes and modifications are possible.

The light-emitting device 13 according to an example embodiment may include a first trench 231, a second trench 232, a third trench 233, and a fourth trench 234. For example, the first trench 231 may have a depth to reach the first semiconductor layer 131 to expose the first semiconductor layer 131, the second trench 232 may have a depth to reach the second semiconductor layer 132 to expose the second semiconductor layer 132, the third trench 233 may have a depth to reach the third semiconductor layer 133 to expose the third semiconductor layer 133, and the fourth trench 234 may have a depth to reach the fourth semiconductor layer 134 to expose the fourth semiconductor layer 134.

One of the first trench 231, the second trench 232, the third trench 233, and the fourth trench 234 may be arranged at a center on the plane of the light-emitting device 13. A plurality of remaining trenches other than a trench arranged at the center may be symmetrical with respect to the center of the plane of the light-emitting device 13.

A first electrode 431 may be on the first trench 231, a second electrode 432 may be on the second trench 232, a third electrode 433 may be on the third trench 233, and a fourth electrode 434 may be on the fourth trench 234. The first electrode 431 and the third electrode 433 may be electrodes having the same polarity such as n-type or p-type, and the second electrode 432 and the fourth electrode 434 may be electrodes having polarities electrically opposite to those of the first electrode 431 and the third electrode 433. The first electrode 431 may have the same conductivity type as that of the first semiconductor layer 131. When adjacent electrodes of the light-emitting device 13 are electrically connected and a voltage is applied to each of the adjacent electrodes, a plurality of colors of light may be independently emitted. That is, according to voltage application, only the first-color light, only the second-color light, only the third-color light, the first-color light and the second-color light, the second-color light and the third-color light, the first-color light and the third-color light, or the first-color light to the third-color light may be emitted.

The second insulating layer 330 may be arranged below an electrode 430 or between electrodes 430 such that a portion of each of the first electrode 431, the second electrode 423, the third electrode 433, and the fourth electrode 434 (a portion extending to the outside of a corresponding trench) is substantially at an equal height or a height difference thereof is within 10% of a thickness of the light-emitting device 13.

A portion of each electrode 430 extending to the outside of the corresponding trench 230 may be substantially at a certain height $t_{13}$ or a height close thereto from the lower surface of the light-emitting device 13. The second insulating layer 330 may be arranged below one electrode 430 or between a plurality of electrodes 430 to make heights of a plurality of electrodes 430 substantially equal or similar. A detailed description thereof is already given above.

However, the disclosure is not limited to the above description, and a vertical electrode structure may be included on the lower surface of the light-emitting cell 100 instead of one trench 230. Referring to FIG. 8, a fourth electrode 434a of the light-emitting device 14 according to an example embodiment may be arranged on the lower surface of the light-emitting cell 100 instead of being arranged extending along the fourth trench 234. The fourth electrode 434a may be arranged in direct contact with the fourth semiconductor layer 134. The first trench 231, the second trench 232, and the third trench 233 may be substantially at a certain height $t_{14}$ or a height close thereto.

In the light-emitting devices 13 and 14 according to FIGS. 6 to 8, one light-emitting device 13 or 14 may emit three different colors of light, so that one light-emitting device 13 or 14 may implement one pixel. Accordingly, because full color may be realized by using a design of each of a well planar shape of a substrate and a planar shape of the light-emitting device 13 or 14 as one design, a freedom in design may be increased, and heights of the plurality of electrodes 430 may be substantially equal to the certain height $t_{13}$ or $t_{14}$ from the lower surface of the light-emitting device 13 or 14 or almost close to the height $t_{13}$ or $t_{14}$, such that convenience in an operation such as transferring or bonding may be increased, and this may be an advantage for the manufacturing of a display apparatus. In addition, because one pixel may be configured with one light-emitting device 13 or 14, the number of light-emitting devices may be reduced compared to manufacturing a display by configuring one pixel with at least three light-emitting devices, thereby lowering a manufacturing cost.

Next, a display apparatus to which a light-emitting device is transferred or disposed according to an example embodiment will be described.

Figure 9:
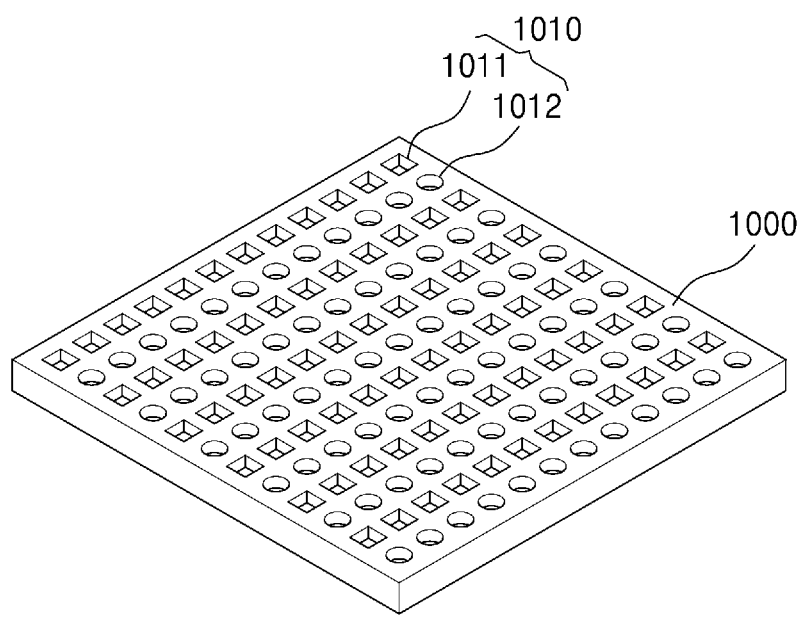
FIG. 9 is a perspective view of a substrate of a display apparatus according to an example embodiment.
Figure 10A:
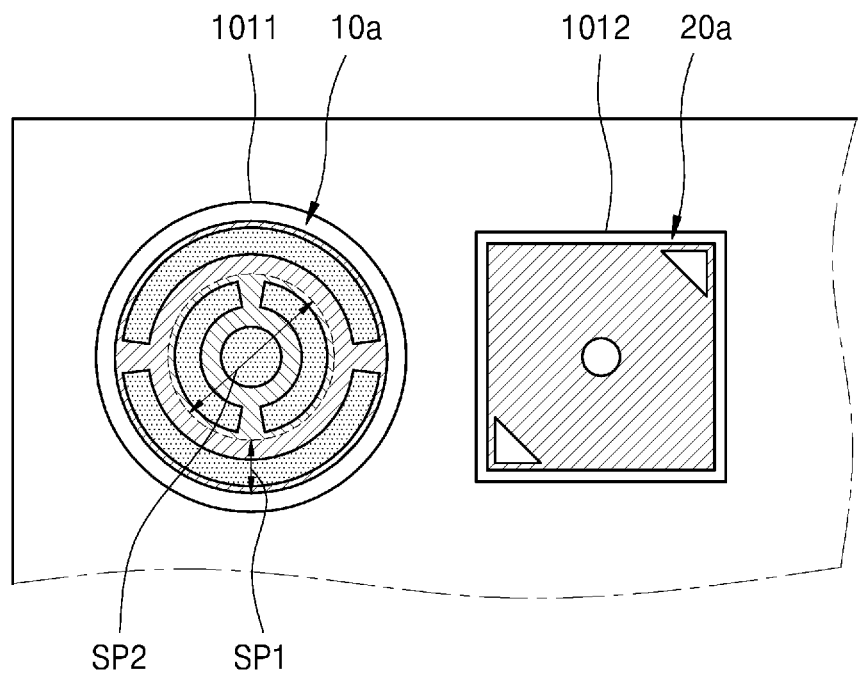
FIG. 10A is a diagram illustrating a first-type light-emitting device and a second-type light-emitting device, which are respectively arranged in a first well and a second well of a substrate of a display apparatus according to an example embodiment.
Figure 10B:
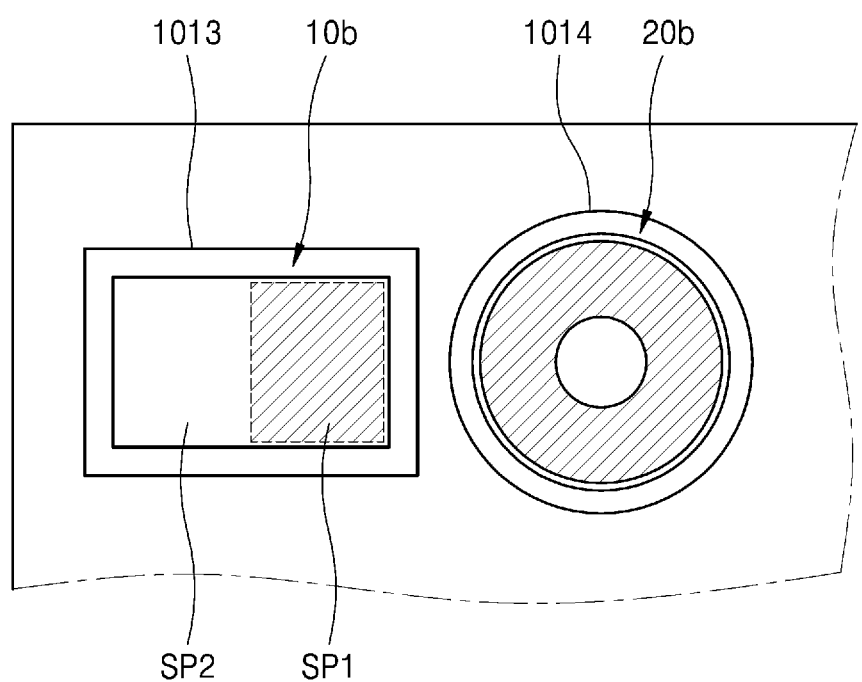
FIG. 10B is a diagram illustrating a third-type light-emitting device and a fourth-type light-emitting device, which are respectively arranged in a third well and a fourth well of a substrate of a display apparatus according to another embodiment.

FIG. 9 is a perspective view of a substrate of a display apparatus according to an example embodiment, FIG. 10A is a diagram illustrating a first-type light-emitting device and a second-type light-emitting device, which are respectively arranged in a first well and a second well of a substrate of a display apparatus according to an example embodiment, and FIG. 10B is a diagram illustrating a third-type light-emitting device and a fourth-type light-emitting device, which are respectively arranged in a third well and a fourth well of a substrate of a display apparatus according to another embodiment.

The display apparatus according to an example embodiment may include an emission layer including a plurality of first-type light-emitting devices 10a and 10b and a plurality of second-type light-emitting devices 20a and 20b, and a driving layer including a substrate including a plurality of wells 1010 and a plurality of transistors. Here, the plurality of first-type light-emitting devices 10a and 10b may be any one of the light-emitting devices 10, 11, 12, 13, and 14 according to the above-described example embodiments. In addition, the plurality of second-type light-emitting devices 20a and 20b may have a different planar shape than those of the plurality of first-type light-emitting devices 10a and 10b, and may emit other color light than a plurality of colors of light emitted by the plurality of first-type light-emitting devices 10a and 10b. Referring to FIGS. 9 and 10a, the plurality of wells 1010 may include a first well 1011 and a second well 1012, wherein the first-type light-emitting device 10a may be exclusively arranged in the first well 1011, and the second-type light-emitting device 20a may be exclusively arranged in the second well 1012. A transistor of the driving layer may be electrically connected to an electrode of a light-emitting device through an electrode pad of the driving layer to switch the light-emitting device. For example, the emission layer and the driving layer may be electrically connected to each other at a certain height by using a method such as soldering, eutectic, and an anisotropic conductive film (ACF). However, the disclosure is not limited to the bonding method as described above, and the emission layer and the driving layer may be electrically connected to each other by a method such as forming the driving layer through a photolithography operation in a state in which the light-emitting device is transferred on the substrate.

The plurality of first-type light-emitting devices 10a and 10b and the plurality of second-type light-emitting devices 20a and 20b described above or to be described below are configured to distinguish whether they are one of the light-emitting devices 10, 11, 12, 13, and 14 according to an example embodiment, and the plurality of first-type light-emitting devices 10a and 10b and the plurality of second-type light-emitting devices 20a and 20b may each have various planar shapes without specific limitation. However, the plurality of second-type light-emitting devices 20a and 20b are not limited to light-emitting devices other than the light-emitting devices 10, 11, 12, 13, and 14 according to an example embodiment, and the light-emitting devices 10, 11, 12, 13, and 14 according to an example embodiment may be light-emitting devices having different planar shapes from those of the plurality of first-type light-emitting devices 10a and 10b.

Referring to FIG. 9, a well 1010 included in the substrate 1000 may be arranged to extend in a direction parallel to the substrate 1000. The first well 1011 and the second well 1012 may be alternately arranged, and the first well 1011 and the second well 1012, which are adjacent to each other, may form one pixel. When the first-type light-emitting device 10a and the second-type light-emitting device 20a are transferred to the substrate 1000, the first-type light-emitting device 10a and the second-type light-emitting device 20a, which are suspended in a suspension solution, may be transferred exclusively to the first well 1011 and the second well 1012, respectively. The first-type light-emitting device 10a according to an example embodiment may emit a plurality of colors of light, so one pixel may be implemented only with the first well 1011 and the second well 1012 which have two shapes, and thus, a degree of freedom with respect to a planar shape design of the well 1010 and a planar shape design of a light-emitting device may be increased. However, the disclosure is not limited thereto, and the substrate 1000 may include a third well 1013 and a fourth well 1014, which have different planar shapes than those of the first well 1011 and the second well 1012, and the first-type light-emitting device 10b and the second-type light-emitting device 20b may also be exclusively arranged in the third well 1013 and the fourth well 1014, respectively.

Referring to FIG. 10A, the first well 1011 among the plurality of wells 1010 of the substrate 1000 may have a circular plane, and the second well 1012 among the plurality of wells 1010 may have a square plane. The first-type light-emitting device 10a may be transferred and arranged to correspond to the first well 1011, and the second-type light-emitting device 20a may be transferred and arranged to correspond to the second well 1012. The first-type light-emitting device 10a may be one of the light-emitting devices 10, 11, 12, 13, and 14 according to the above-described example embodiments, and may emit a plurality of colors of light. The first well 1011 and the second well 1012, which are adjacent to each other, may form one pixel. For example, the first-type light-emitting device 10a may emit green light G from the first light-emitting plane SP1, and may emit blue light B from the second light-emitting plane SP2. The green light G may have a wavelength of about 495 nm to about 570 nm, and the blue light B may have a wavelength of about 420 nm to about 495 nm. The second-type light-emitting device 20a may emit red light R. The red light R may have a wavelength of about 620 nm to about 750 nm. However, a wavelength range of color light emitted by the first-type light-emitting device 10a is not limited to the blue light B, the green light G, or the red light R, and other wavelength ranges may be possible. For example, the color light emitted by the first-type light-emitting device 10a is not limited to the blue light B, the green light G, and the red light R, and may include violet light having a wavelength of about 380 nm to about 450 nm, cyan light having a wavelength of about 475 nm to about 510 nm, yellow light having a wavelength of about 565 nm to about 590 nm, and/or orange light having a wavelength of about 590 nm to about 620 nm.

Because the first-type light-emitting device 10a may emit two or more colors of light, a planar shape of the well 1010 and planar shapes of the light-emitting devices 10a and 20a are two different designs, respectively, a degree of freedom in the design of the well planar shape and the planar shape of the light-emitting device may be increased rather than requiring three different designs. However, the above embodiment is only an example embodiment, and a planar shape of the first well 1011 and a planar shape of the second well 1012 or the planar shapes of the first-type light-emitting device 10a and the second-type light-emitting device 20a are not limited to the above embodiment and may have various shapes.

Referring to FIG. 10B, the plurality of wells 1010 of the substrate 1000 may include the third well 1013 and the fourth well 1014. The third well 1013 of the plurality of wells 1010 may have a rectangular plane, and the fourth well 1014 of the plurality of wells 1010 may have a circular shape. The first-type light-emitting device 10b may be transferred to correspond to the third well 1013, and in particular, the light-emitting device 12 according to FIGS. 4 and 5A is the first-type light-emitting device 10b, and may be arranged to correspond to the third well 1013. The second-type light-emitting device 20b may be arranged to correspond to the fourth well 1014. The left half of the first-type light-emitting device 10b may be the second light-emitting plane SP2 emitting green light G, and the right half thereof may be the first light-emitting plane SP1 emitting blue light B. In addition to an arrangement as described above, as described with reference to FIGS. 5B and 5C, the first-type light-emitting device 10b may operate normally even when being rotated 180 degrees and inserted and arranged.

FIG. 11 is a cross-sectional view of a substrate 1000 of a display apparatus according to an example embodiment.

Referring to FIG. 11, the first-type light-emitting device 10a may be arranged in the first well 1011 among the plurality of wells 1010, and the second-type light-emitting device 20a may be arranged in the second well 1012 among the plurality of wells 1010. A thickness $t_{10a}$ of the first-type light-emitting device 10a may be the same as or different from a thickness $t_{20a}$ of the second-type light-emitting device 20a. In the former case, a depth of the first well 1011 and a depth of the second well 1012 may be configured to be substantially equal to each other. In the latter case, the depth of the first well 1011 and the depth of the second well 1012 may be differently configured such that a plurality of electrodes of the first-type light-emitting device 10a and at least one electrode of the second-type light-emitting device 20a have a height substantially equal to or close to a certain height $T_1$ from a lower surface of the substrate 1000. A portion of each electrode extending from a corresponding trench of the first-type light-emitting device 10a may be at a height substantially equal to the certain height $T_1$ or may be positioned to have a height difference within 10% of a thickness of the first-type light-emitting device 10a with the certain height $T_1$. At least one electrode of the second-type light-emitting device 20a may be at a height substantially equal to the certain height $T_1$ or may be positioned to have a height difference within 10% of the thickness $t_{10a}$ of the first-type light-emitting device 10a with the certain height $T_1$. For example, when the thickness $t_{10a}$ of the first-type light-emitting device 10a is greater than the thickness $t_{20a}$ of the second-type of light-emitting device 20a, the depth of the first well 1011 may be greater than the depth of the second well 1012. A difference between the thickness $t_{10a}$ of the first-type light-emitting device 10a and the thickness $t_{20a}$ of the second-type light-emitting device 20a may be substantially equal to a depth difference between the first well 1011 and the second well 1012 or may have a length difference within 10% of the thickness $t_{10a}$ of the first-type light-emitting device 10a with a depth difference value between the first well 1011 and the second well 1012. The disclosure is not limited thereto, and the first-type light-emitting device 10b having a different shape and the second-type light-emitting device 20b having a different shape may be arranged according to a planar shape of the well 1010.

Figure 12A:
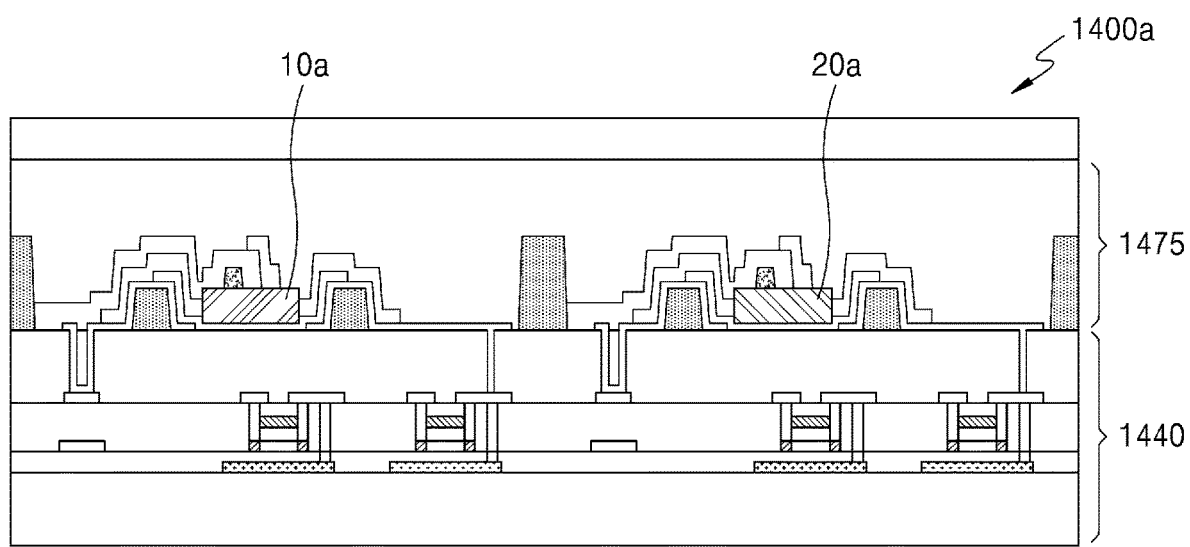
FIG. 12A is a cross-sectional view of a display apparatus according to an example embodiment.
Figure 12B:
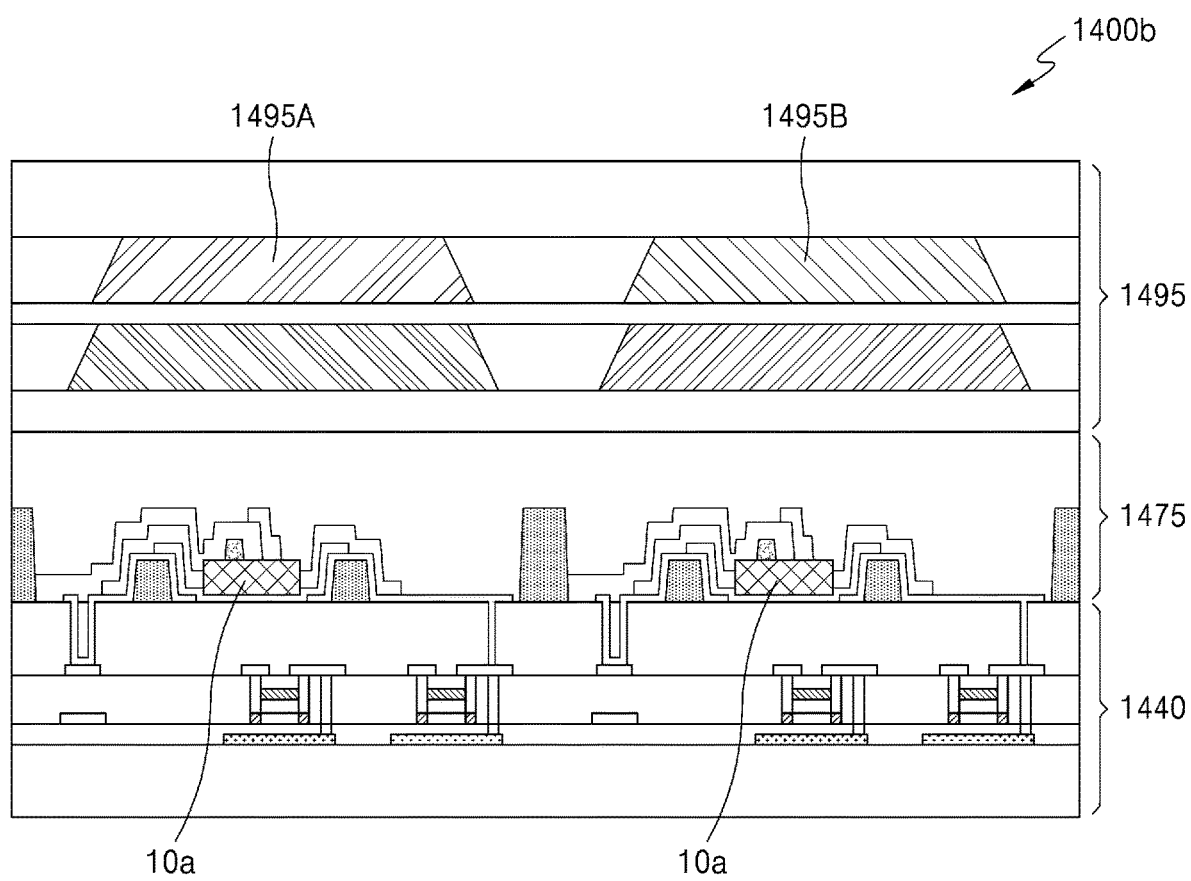
FIG. 12B is a cross-sectional view of a display apparatus further including a color conversion layer, according to an example embodiment.

FIG. 12A is a cross-sectional view of a display apparatus 1400a according to an example embodiment, and FIG. 12B is a cross-sectional view of a display apparatus 1400b further including a color conversion layer, according to an example embodiment.

Referring to FIGS. 12A and 12B, the display apparatuses 1400a and 1400b according to example embodiments may include a plurality of light-emitting devices according to the above-described example embodiments. At this time, at least one of the plurality of light-emitting devices may be the light-emitting devices 10, 11, 12, 13, and 14 described with reference to FIGS. 1 to 8. The plurality of light-emitting devices may be transferred and fixed on a driving layer 1440 of each of the display apparatuses 1400a and 1400b to form a plurality of pixels. When the plurality of light-emitting devices are transferred to the driving layer 1440, the plurality of light-emitting devices may be electrically connected to a plurality of transistors, respectively, and a light-emitting device may operate according to a signal of a corresponding transistor. An emission layer 1475 including the plurality of light-emitting devices may be passivated. In order for a display to implement full color, a red green blue (RGB) display method in which each of light-emitting devices emitting red light R, green light G, and blue light B is transferred and fixed to one pixel may be used, and a method of using a color conversion layer in which a color conversion layer 1495 is formed after transferring and fixing a light-emitting device emitting blue light B to one pixel may be used. Because at least one of the plurality of light-emitting devices according to an example embodiment may emit a plurality of colors of light, it may be to use the RGB display method. FIG. 12A shows that the first-type light-emitting device 10a emitting green light G and blue light B and the second-type light-emitting device 20a emitting red light R are transferred into one pixel of the display apparatus 1400a. The first-type light-emitting device 10a and the second-type light-emitting device 20a of the display apparatus 1400a according to an example embodiment may configure one pixel. The disclosure is not limited thereto, and the first-type light-emitting device 10b having a different shape and the second-type light-emitting device 20b having a different shape may also be arranged according to a well planar shape.

FIG. 12B shows that the first-type light-emitting device 10a emitting green light G and blue light B are transferred to one pixel of the display apparatus 1400b, and the color conversion layer 1495 is arranged on the emission layer 1475. The color conversion layer 1495 may include a first color conversion layer converting first-color light from the first-type light-emitting device 10a into third-color light, a second conversion layer converting second-color light into the third-color light, and/or a resin transmitting the first-color light and the second-color light without color conversion. The first-color light may be green light G, the second-color light may be blue light B, and the third-color light may be red light R. A resin 1495A may be arranged on one first-type light-emitting device 10a arranged in one pixel, and the one first-type light-emitting device 10a may emit green light G and blue light B. A first color conversion layer 1495B and/or the second color conversion layer may be arranged on other first-type light-emitting device 10a arranged in one pixel. When only the first color conversion layer 1495B is arranged, the other first-type light-emitting device 10a may be electrically connected to the driving layer 1440 to be capable of emitting green light G. When only the second color conversion layer is arranged, the other first-type light-emitting device 10a may be electrically connected to the driving layer 1440 to be capable of emitting blue light B. When the first color conversion layer 1495B and the second color conversion layer are arranged, the first color conversion layer 1495B may be arranged on the second color conversion layer, and the other first-type light-emitting device 10a may be electrically connected to the driving layer 1440 to be capable of emitting green light G and/or blue light B. Because color light passing through a color conversion layer through the other first-type light-emitting device 10a may be converted to red light R by the color conversion layer 1495, the two first-type light-emitting devices 10a may configure one pixel.

However, the disclosure is not limited thereto, and because one light-emitting device 13 or 14 according to an example embodiment may configure one pixel by emitting three or more colors of light, full color may be implemented without using the RGB display method or the method of using the color conversion method.

Figure 13:
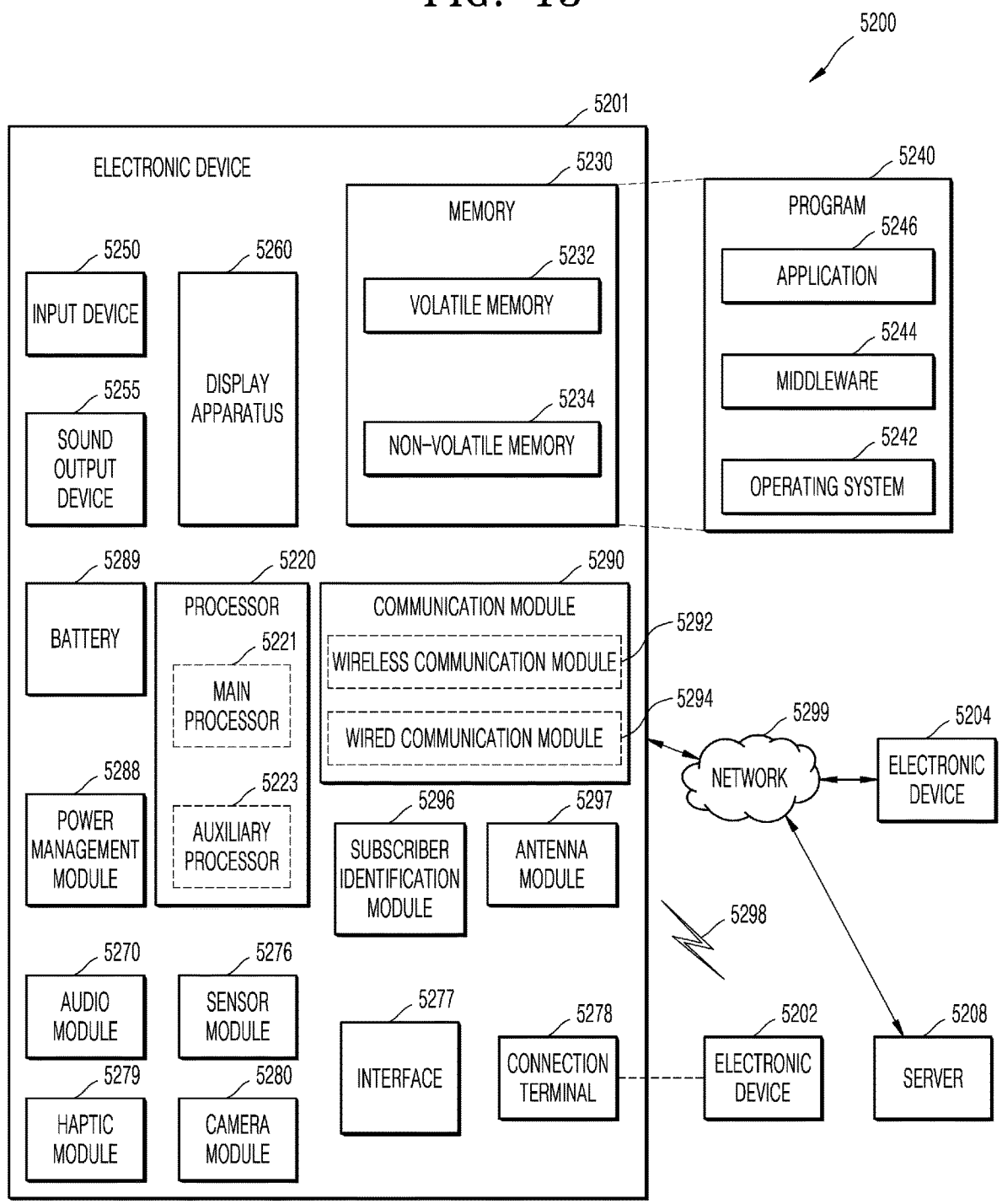
FIG. 13 is a block diagram of an electronic device including a display apparatus according to an example embodiment.

FIG. 13 is a block diagram of an electronic device 5201 including a display apparatus 5260 according to an example embodiment.

Referring to FIG. 13, the electronic device 5201 may be included in a network environment 5200. In the network environment 5200, the electronic device 5201 may communicate with another electronic device 5202 through a first network 5298 (a near-field wireless communication network or the like), or may communicate with another electronic device 5204 and/or a server 5208 through a second network 5299 (a long-distance wireless communication network or the like. The electronic device 5201 may communicate with the electronic device 5204 through the server 5208. The electronic device 5201 may include a processor 5220, a memory 5230, an input device 5250, a sound output device 5255, the display apparatus 5260, an audio module 5270, a sensor module 5276, an interface 5277, a haptic module 5279, a camera module 5280, a power management module 5288, a battery 5289, a communication module 5290, a subscriber identification module 5296, and/or an antenna module 5297. In the electronic device 5201, some of the above components may be omitted, and other components may be added. Some of the above components may be implemented as one integrated circuit. For example, the sensor module 5276 (a fingerprint sensor, an iris sensor, an illuminance sensor, or the like) may be implemented by being embedded in the display apparatus 5260 (a display or the like).

The processor 5220 may execute software (such as a program 5240 or the like) to control one or a plurality of other components (hardware, software components, or the like) of the electronic device 5201, wherein the components are connected to the processor 5220, and may perform various data processing or operations. As a portion of data processing or operations, the processor 5220 may load commands and/or data received from other components (the sensor module 5276, the communication module 5290, or the like) into a volatile memory 5232, process commands and/or data stored in the volatile memory 5232, and store result data in a non-volatile memory 5234. The processor 5220 may include a main processor 5221 (a central processing unit, an application processor, or the like), and an auxiliary processor 5223 (a graphics processing unit, an image signal processor, a sensor hub processor, a communication processor, or the like) which may operate independently or together with the main processor 5221. The auxiliary processor 5223 may use less power than that of the main processor 5221, and may perform a specialized function.

The auxiliary processor 5223 may control functions and/or states related to some of the components (the display apparatus 5260, the sensor module 5276, the communication module 5290, or the like) of the electronic device 5201 on behalf of the main processor 5221 while the main processor 5221 is in an inactive state (sleep state) or together with the main processor 5221 while the main processor 5221 is in an active state (application execution state). The auxiliary processor 5223 (an image signal processor, a communication processor, or the like) may be implemented as a portion of other functionally-related components (the camera module 5280, the communication module 5290, or the like).

The memory 5230 may store various data required by the components (the processor 5220, the sensor module 5276, or the like) of the electronic device 5201. Data may include, for example, input data and/or output data for software (the program 5240 or the like) and commands related thereto. The memory 5230 may include the volatile memory 5232 and/or the non-volatile memory 5234.

The program 5240 may be stored as software in the memory 5230, and may include an operating system 5242, a middleware 5244, and/or an application 5426.

The input device 5250 may receive commands and/or data to be used by a component (the processor 5220 or the like) of the electronic device 5201 from the outside (a user or the like) of the electronic device 5201. The input device 5250 may include a remote controller, a microphone, a mouse, a keyboard, and/or a digital pen (such as a stylus pen).

The sound output device 5255 may output a sound signal to the outside of the electronic device 5201. The sound output device 5255 may include a speaker and/or a receiver. The speaker may be used for general purposes, such as multimedia playback or recording playback, and the receiver may be used to receive incoming calls. The receiver may be incorporated as a portion of the speaker, or may be implemented as an independent separate device.

The display apparatus 5260 may visually provide information to the outside of the electronic device 5201. The display apparatus 5260 may include a display, a hologram device, or a projector, and a control circuit for controlling a corresponding device. The display apparatus 5260 may include any of the light-emitting devices 10, 11, 12, 13, 14 described with reference to FIGS. 1 to 8. The display apparatus 5260 may include a touch circuitry configured to sense a touch, and/or a sensor circuitry (a pressure sensor or the like) configured to measure an intensity of a force generated by a touch.

The audio module 5270 may convert a sound into an electrical signal, or conversely, convert an electrical signal into a sound. The audio module 5270 may obtain a sound through the input device 5250, or may output a sound through a speaker and/or headphones of the sound output device 5255 and/or another electronic device (the electronic device 5202 or the like) directly or wirelessly connected to the electronic device 5201.

The sensor module 5276 may sense an operating state (power, temperature, or the like) of the electronic device 5201 or an external environmental state (user state or the like), and may generate an electrical signal and/or a data value corresponding to the sensed state. The sensor module 5276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 5277 may support one or more designated protocols that may be used by the electronic device 5201 to directly or wirelessly connect with another electronic device (the electronic device 5202 or the like). The interface 5277 may include a high definition multimedia interface (HDMI), a universal serial bus (USB) interface, a secure digital (SD) card interface, and/or an audio interface.

A connection terminal 5278 may include a connector through which the electronic device 5201 may be physically connected to another electronic device (the electronic device 5202 or the like). The connection terminal 5278 may include an HDMI connector, a USB connector, an SD card connector, and/or an audio connector (a headphone connector or the like).

The haptic module 5279 may convert an electrical signal into a mechanical stimulus (vibration, movement, or the like) or an electrical stimulus that the user may recognize through a tactile or kinesthetic sense. The haptic module 5279 may include a motor, a piezoelectric element, and/or an electrical stimulation device.

The camera module 5280 may capture a still image and a video. The camera module 5280 may include a lens assembly including one or more lenses, image sensors, image signal processors, and/or flashes. The lens assembly included in the camera module 5280 may collect light emitted from an object, which is a target of image capturing.

The power management module 5288 may manage power supplied to the electronic device 5201. The power management module 5288 may be implemented as a portion of a power management integrated circuit (PMIC).

The battery 5289 may supply power to the components of the electronic device 5201. The battery 5289 may include a non-rechargeable primary cell, a rechargeable secondary cell, and/or a fuel cell.

The communication module 5290 may establish a direct (wired) communication channel and/or wireless communication channel between the electronic device 5201 and another electronic devices (the electronic device 5202, the electronic device 5204, the server 5208, or the like) and support performing communication through the established communication channel. The communication module 5290 may include one or more communication processors that operate independently of the processor 5220 (an application processor or the like) and support direct communication and/or wireless communication. The communication module 5290 may include a wireless communication module 5292 (a cellular communication module, a near-field wireless communication module, a global navigation satellite system (GNSS), or the like) and/or a wired communication module 5294 (a local area network (LAN) communication module, a power line communication module, or the like). A corresponding communication module among these communication modules may communicate with other electronic devices through the first network 5298 (a near-field network such as Bluetooth, Wi-Fi Direct, or infrared data association (IrDA)) or the second network 5299 (a long-distance communication network such as a cellular network, the Internet, or a telecommunications network such as a computer network (LAN, WAN, or the like)). These various types of communication modules may be integrated into one component (a single chip or the like) or may be implemented as a plurality of components (a plurality of chips) separate from each other. The wireless communication module 5292 may use subscriber information (an international mobile subscriber identifier (IMSI) or the like) stored in the subscriber identification module 5296 to identify and authenticate the electronic device 5201 within a communication network such as the first network 5298 and/or the second network 5299.

The antenna module 5297 may transmit or receive signals and/or power to the outside (other electronic devices or the like). An antenna may include a radiator having a conductive pattern formed on a substrate (printed circuit board (PCB) or the like). The antenna module 5297 may include one or a plurality of antennas. When a plurality of antennas are included, an antenna suitable for a communication method used in a communication network such as the first network 5298 and/or the second network 5299 may be selected from among the plurality of antennas by the communication module 5290. Signals and/or power may be transmitted or received between the communication module 5290 and other electronic devices through the selected antenna. In addition to the antenna, other components (a radio-frequency integrated circuit (RFIC) or the like) may be included as a portion of the antenna module 5297.

Some of components may be connected to each other through communication methods (bus, general purpose input and output (GPIO), a serial peripheral interface (SPI), a mobile industry processor interface (MIPI), or the like) between peripheral devices and exchange signals (commands, data, or the like).

The commands or data may be transmitted or received between the electronic device 5201 and the electronic device 5204 outside through the server 5208 connected to the second network 5299. The other electronic devices 5202 and 5204 may be the same or different types of the electronic device 5201. All or a portion of operations executed in the electronic device 5201 may be executed in one or more of the other electronic devices 5202 and 5204, and the server 5208. For example, when the electronic device 5201 needs to perform a function or a service, the electronic device 5201 may request one or more other electronic devices to perform a portion or the whole of the function or service instead of executing the function or service itself. The one or more other electronic devices receiving the request may execute an additional function or service related to the request, and transmit an execution result to the electronic device 5201. To this end, cloud computing, distributed computing, and/or client-server computing technologies may be used.

Figure 14:
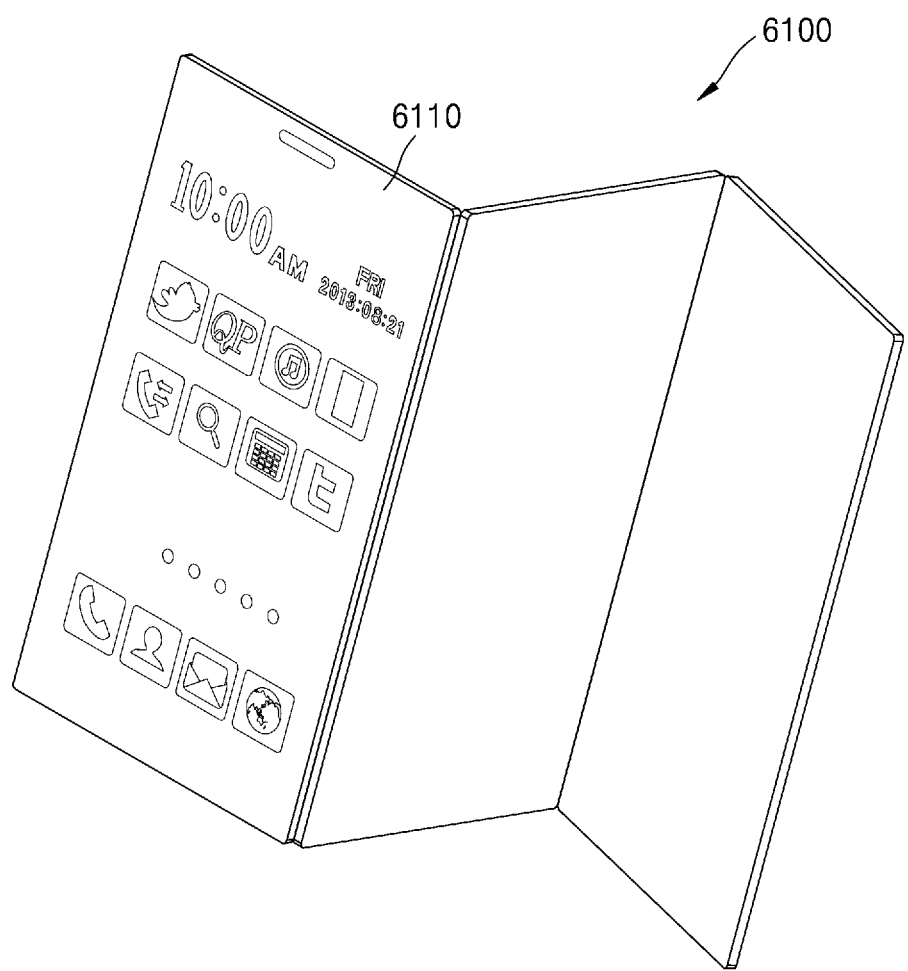
FIG. 14 shows an example in which a display apparatus according to an example embodiment is applied to a mobile device.

FIG. 14 shows an example in which a display apparatus 6110 according to an example embodiment is applied to a mobile device 6100. The mobile device 6100 may include the display apparatus 6110 according to an example embodiment. The display apparatus 6110 may include any of the light-emitting devices 10, 11, 12, 13, and 14 described with reference to FIGS. 1 to 8. The display apparatus 6110 may have a foldable structure, and may be applied to, for example, a multi-folder display. Here, although the mobile device 6100 is illustrated as a folder-shape display, the mobile device 6100 may also be applicable to a general flat panel display.

Figure 15:
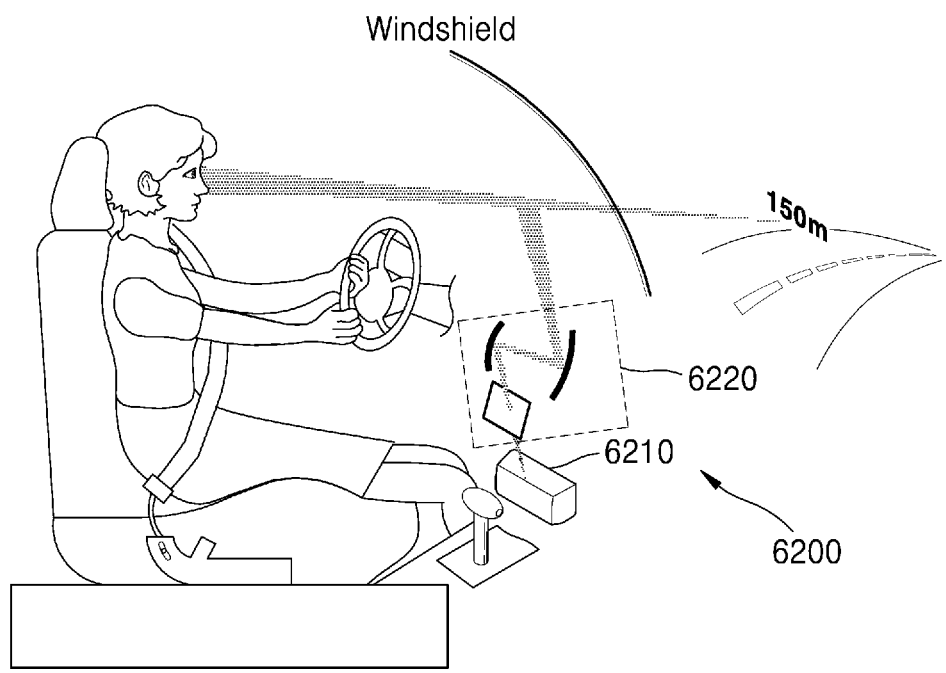
FIG. 15 shows an example in which a display apparatus according to an example embodiment is applied to a vehicle.

FIG. 15 shows an example in which a display apparatus according to an example embodiment is applied to a vehicle. The display apparatus may be applied to a head-up display apparatus 6200 for a vehicle. The head-up display apparatus 6200 may include a display apparatus 6210 provided in an area of the vehicle, and at least one light path changing member 6220 converting a light path so that a driver may view an image generated by the display apparatus 6210. The display apparatus 6210 may include any of the light-emitting devices 10, 11, 12, 13, and 14 described with reference to FIGS. 1 to 8.

Figure 16:
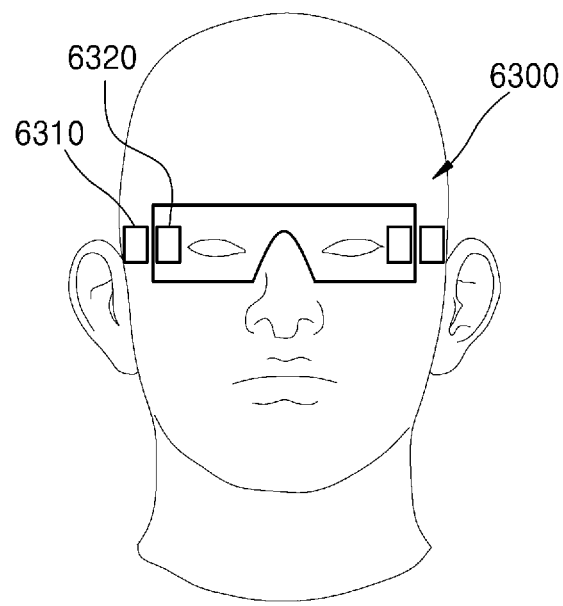
FIG. 16 shows an example in which a display apparatus according to an example embodiment is applied to augmented reality glasses or virtual reality glasses.

FIG. 16 shows an example in which a display apparatus according to an example embodiment is applied to augmented reality glasses 6300 or virtual reality glasses. The augmented reality glasses 6300 may include a projection system 6310 that forms an image, and at least one element 6320 that guides the image from the projection system 6310 into a user's eye. The projection system 6310 may include any of the light-emitting devices 10, 11, 12, 13, and 14 described with reference to FIGS. 1 to 8.

Figure 17:
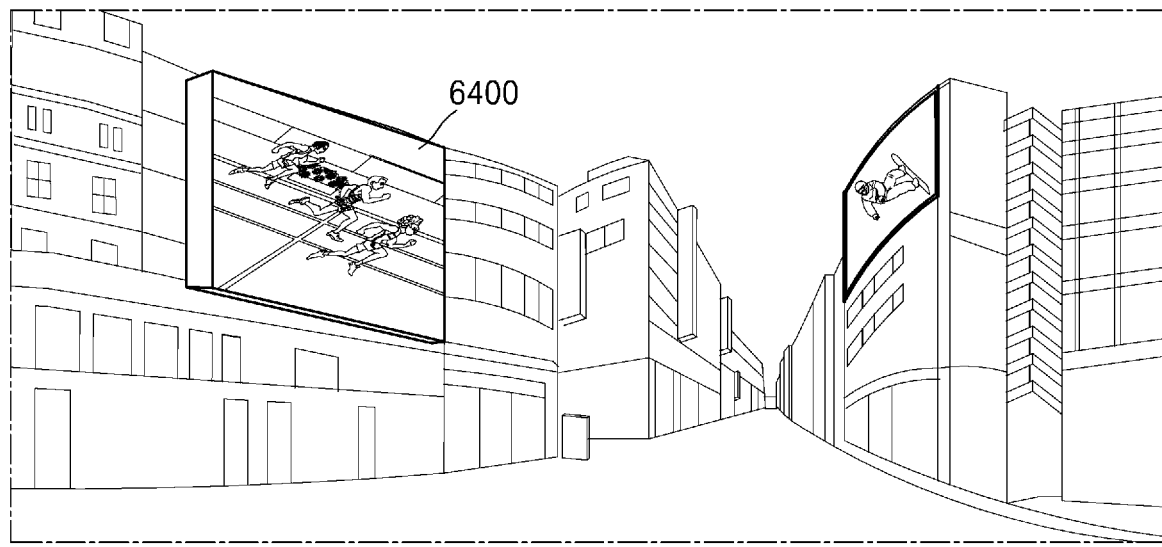
FIG. 17 shows an example in which a display apparatus according to an example embodiment is applied to a large-sized signage.

FIG. 17 shows an example in which a display apparatus according to an example embodiment is applied to a large-sized signage 6400. The signage 6400 may be used for outdoor advertisement using a digital information display, and may control advertisement contents or the like through a communication network. The signage 6400 may be implemented, for example, through the electronic device described with reference to FIG. 13. The signage 6400 may include any of the light-emitting devices 10, 11, 12, 13, and 14 described with reference to FIGS. 1 to 8.

Figure 18:
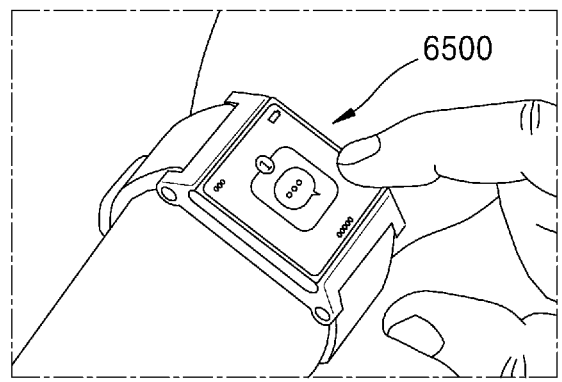
FIG. 18 shows an example in which a display apparatus according to an example embodiment is applied to a wearable device.

FIG. 18 shows an example in which a display apparatus according to an example embodiment is applied to a wearable device 6500. The wearable display 6500 may include any of the light-emitting devices 10, 11, 12, 13, and 14 described with reference to FIGS. 1 to 8, and may be implemented through the electronic device described with reference to FIG. 13.

The display apparatus according to an example embodiment may also be applied to various products such as a rollable TV and a stretchable display.

A light-emitting device according to an example embodiment may emit two or more colors or light.

Because a plurality of electrodes of the light-emitting device according to an example embodiment are substantially at the same height in a direction of one surface of the light-emitting device the light-emitting device may be suitable for a transfer and bonding operation or the like, and may be may be suitable for manufacturing a display apparatus.

As the light-emitting device according to an example embodiment may emit two or more colors of light, when the light-emitting device is transferred, full color may be implemented by using at most two or less light-emitting devices instead of three types of light-emitting devices, so that a degree of freedom in designing a well planar shape of a substrate and a corresponding planar shape of the light-emitting device may be increased.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a light-emitting cell comprising a first semiconductor layer, a first active layer emitting first-color light, a second semiconductor layer, a second active layer emitting second-color light, and a third semiconductor layer, wherein the first semiconductor layer is provided on the first active layer, the first active layer is provided on the second semiconductor layer, the second semiconductor layer is provided on the second active layer, and the second active layer is provided on the third semiconductor layer;
an insulating layer provided on the light-emitting cell, the insulating layer having a flat upper surface;
a first trench exposing the first semiconductor layer by penetrating through the insulating layer;
a second trench exposing the second semiconductor layer by penetrating through the insulating layer;
a first electrode extending from the first semiconductor layer to an upper surface of the insulating layer along the first trench;
a second electrode extending from the second semiconductor layer to the upper surface of the insulating layer along the second trench; and
a third electrode provided to be in contact with the third semiconductor layer,
wherein a thickness of a first portion of the insulating layer adjacent to the first electrode is different than a thickness of a second portion of the insulating layer adjacent the second electrode.

2. The light-emitting device of claim 1,
wherein the insulating layer comprises:
a first insulating layer provided on an upper surface of the light-emitting cell, side surfaces of the first trench, and side surfaces of the second trench; and
a second insulating layer arranged on an upper surface the first insulating layer and configured to reduce a difference between a height of a portion of the first electrode extending outside of the first trench and a portion of the second electrode extending outside of the second trench.

3. The light-emitting device of claim 2,
wherein a first height of the first electrode from a lower surface of the light-emitting device and a second height of the second electrode from the lower surface of the light-emitting device are substantially equal, or within 10% of a thickness of the light-emitting device.

4. The light-emitting device of claim 1, further comprising a third trench exposing the third semiconductor layer by penetrating the insulating layer and a partial area of the light-emitting cell,
wherein the third electrode extends from the third semiconductor layer to the upper surface of the insulating layer along the third trench.

5. The light-emitting device of claim 4,
wherein the first active layer is configured to emit the first-color light,
wherein the second active layer is configured to emit the second-color light, and
wherein only the first active layer or the second active layer is arranged in a partial area of the light-emitting cell viewed from a top view.

6. The light-emitting device of claim 4,
wherein the first semiconductor layer and the third semiconductor layer have a same polarity, and the second semiconductor layer has a polarity different from the polarity of the first semiconductor layer,
the first electrode and the third electrode have a same polarity, and the second electrode has a polarity opposite to the polarity of the first electrode.

7. The light-emitting device of claim 4,
wherein the light-emitting cell is configured to emit the first-color light as the second electrode is connected to the first electrode, and
the light-emitting cell is configured to emit the second-color light as the second electrode is connected to the third electrode.

8. The light-emitting device of claim 4,
wherein the second semiconductor layer comprises a first sub-semiconductor layer and a second sub-semiconductor layer,
the second trench comprises a first sub-trench and a second sub-trench spaced apart from the first sub-trench,
the first sub-trench exposes the first sub-semiconductor layer by penetrating through the insulating layer,
the second sub-trench exposes the second sub-semiconductor layer by penetrating through the insulating layer and a partial area of the light-emitting cell,
the second electrode comprises a first sub-electrode and a second sub-electrode spaced apart from the first sub-electrode,
the first sub-electrode extends from the first sub-semiconductor layer to the upper surface of the insulating layer along the first sub-trench, and
the second sub-electrode extends from the second sub-semiconductor layer to the upper surface of the insulating layer along the second sub-trench.

9. The light-emitting device of claim 8,
wherein the second sub-semiconductor layer has a greater width than a width of the first sub-semiconductor layer.

10. The light-emitting device of claim 8,
wherein the first electrode is electrically connected to the first sub-electrode, and the first active layer is configured to emit the first-color light, and
the third electrode is electrically connected to the second sub-electrode, and the second active layer is configured to emit the second-color light.

11. The light-emitting device of claim 8,
wherein a position of the first electrode or a position of the first sub-electrode of the light-emitting device arranged in a first direction does not overlap a position of the second electrode or a position of the second sub-electrode of the light-emitting device arranged in a second direction rotated by 180 degrees in the first direction.

12. The light-emitting device of claim 1,
wherein the light-emitting cell comprises a first-color light-emitting structure and a second-color light-emitting structure,
the second semiconductor layer is comprised in common in the first-color light-emitting structure and the second-color light-emitting structure, and
no bonding layer is between the first-color light-emitting structure and the second-color light-emitting structure.

13. The light-emitting device of claim 1, further comprising a distributed Bragg reflector (DBR) layer between the first active layer and the second active layer,
wherein, in the DBR layer, a reflectance of the first-color light is greater than a transmittance of the first-color light, and a transmittance of the second-color light is greater than a reflectance of the second-color light.

14. The light-emitting device of claim 1,
wherein the third electrode is provided on a lower surface of the light-emitting cell,
wherein the second electrode is electrically connected to the first electrode, and wherein the first active layer is configured to emit the first-color light,
the second electrode is electrically connected to the third electrode, and the second active layer is configured to emit the second-color light.

15. The light-emitting device of claim 1,
wherein the light-emitting cell further comprises a third active layer emitting third-color light, and
the first-color light, the second-color light, and the third-color light configure one pixel.

16. The light-emitting device of claim 1,
wherein the second electrode is arranged at a center of the light-emitting device, and
the first electrode is symmetrical with respect to the center of the light-emitting device.

17. The light-emitting device of claim 1,
wherein a planar shape of the light-emitting device is rotationally symmetric with respect to at least one angle.

18. The light-emitting device of claim 1,
wherein the light-emitting device has a circular, elliptical, or polygonal plane.

19. A display apparatus comprising:
an emission layer comprising a first-type light-emitting device according to claim 1, the first-type light-emitting device having a first planar shape and configured to emit a plurality of colors of light;
a second-type light-emitting device having a second planar shape different from the first planar shape of the first-type light-emitting device and configured to emit a different color of light from the plurality of colors of light; and
a driving layer comprising a substrate and a plurality of transistors, wherein the substrate comprises a plurality of wells,
wherein the plurality of wells comprise a first well and a second well, which are adjacent to each other,
the first-type light-emitting device is exclusively arranged in the first well,
the second-type light-emitting device is exclusively arranged in the second well, and
the first well and the second well configure one pixel.

20. The display apparatus of claim 19,
wherein the first well has a first depth,
the first depth is a depth such that a height of each the first electrode, the second electrode and the third electrode from the lower surface of the light-emitting device substantially same or within 10% of a thickness of the first-type light-emitting device,
the second well has a second depth,
the second depth is a depth such that at least one electrode comprised in the second-type light-emitting device arranged in the second well is substantially at the height, or is a depth such that the at least one electrode has a height difference within 10% of a thickness of the first-type light-emitting device with the height.

21. The light-emitting device of claim 1,
wherein the insulating layer comprises:
a first insulating layer provided on an upper surface of the light-emitting cell; and
a second insulating layer provided on an upper surface the first insulating layer,
wherein a thickness of a first portion of the second insulating layer adjacent the first electrode is different than a thickness of a second portion of the second insulating layer adjacent the second electrode.

22. The light-emitting device of claim 1,
wherein an upper surface of the first semiconductor layer contacts a lower surface of the first portion of the insulating layer, and
wherein an upper surface of the second semiconductor layer contacts a lower surface of the second portion of the insulating layer.

23. The light-emitting device of claim 1,
wherein the thickness of the first portion of the insulating layer is smaller than the thickness of the second portion of the insulating layer.

* * * * *